United States Patent
Singh et al.

(10) Patent No.: US 10,997,333 B1
(45) Date of Patent: May 4, 2021

(54) METHODS, SYSTEMS, AND COMPUTER PROGRAM PRODUCT FOR CHARACTERIZING AN ELECTRONIC DESIGN WITH A SCHEMATIC DRIVEN EXTRACTED VIEW

(71) Applicant: Cadence Design Systems, Inc., San Jose, CA (US)

(72) Inventors: Balvinder Singh, Noida (IN); Arnold Jean Marie Gustave Ginetti, Antibes (FR); Sutirtha Kabir, Chandler, AZ (US); Diwakar Mohan, Ghaziabad (IN); Madhur Sharma, Ghaziabad (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/705,125

(22) Filed: Dec. 5, 2019

(51) Int. Cl.
G06F 30/31 (2020.01)
G06F 30/392 (2020.01)
G06F 30/367 (2020.01)

(52) U.S. Cl.
CPC ............ G06F 30/31 (2020.01); G06F 30/392 (2020.01); G06F 30/367 (2020.01)

(58) Field of Classification Search
CPC ....... G06F 30/31; G06F 30/392; G06F 30/367
USPC ........................................................ 716/102
See application file for complete search history.

(56) References Cited

U.S. PATENT DOCUMENTS

| | | | |
|---|---|---|---|
| 4,457,027 A | 7/1984 | Gladstone | |
| 6,145,117 A * | 11/2000 | Eng | G06F 30/39 |
| | | | 716/105 |
| 6,236,956 B1 | 5/2001 | Mantooth | |
| 6,366,874 B1 | 4/2002 | Lee | |
| 6,397,370 B1 | 5/2002 | Fernandez | |
| 6,865,725 B2 | 3/2005 | Dickey | |
| 7,089,512 B2 | 8/2006 | Iadanza | |
| 7,120,893 B2 | 10/2006 | Sasaki | |
| 7,159,202 B2 | 1/2007 | Lee | |
| 7,206,731 B2 | 4/2007 | Sercu | |
| 7,257,799 B2 | 8/2007 | McKenney | |
| 7,418,683 B1 | 8/2008 | Sonnard | |
| 7,451,069 B2 | 11/2008 | Moosburger | |
| 7,468,982 B2 | 12/2008 | Mehra | |
| 7,555,739 B1 | 6/2009 | Ginetti | |
| 7,779,286 B1 | 8/2010 | Pritchard | |
| 7,802,221 B1 | 9/2010 | Brink | |
| 8,136,071 B2 | 3/2012 | Solomon | |
| 8,176,463 B2 | 5/2012 | O'Riordan | |

(Continued)

OTHER PUBLICATIONS

U.S. Appl. No. 16/157,001, filed Oct. 10, 2018.
U.S. Appl. No. 15/931,553, filed May 13, 2020.
U.S. Appl. No. 15/931,547, filed May 13, 2020.

*Primary Examiner* — Suresh Memula
(74) *Attorney, Agent, or Firm* — Vista IP Law Group, LLP

(57) ABSTRACT

Disclosed are methods, systems, and articles of manufacture for characterizing an electronic design with a schematic driven extracted view. These techniques identify a schematic of an electronic design, wherein the schematic exists in one or more design fabrics. These techniques further determine an extracted model for characterizing a behavior of the electronic design based at least in part upon the schematic, determine a hierarchical level in a design fabric of the one or more design fabrics of the schematic, and characterize the electronic design with at least an extracted view.

20 Claims, 34 Drawing Sheets

(56) References Cited

U.S. PATENT DOCUMENTS

| | | |
|---|---|---|
| 8,191,035 B1 | 5/2012 | Van Brink |
| 8,209,650 B2 | 6/2012 | St. John |
| 8,261,228 B1 | 9/2012 | Gopalakrishnan |
| 8,286,025 B1 | 10/2012 | Pritchard |
| 8,584,072 B1 | 11/2013 | Gopalakrishnan |
| 8,612,921 B1 | 12/2013 | Gopalakrishnan |
| 8,656,329 B1 | 2/2014 | Kukal |
| 8,689,169 B2 | 4/2014 | Fischer |
| 8,707,230 B1 | 4/2014 | Hu |
| 8,726,207 B2 | 5/2014 | Jiang |
| 8,732,636 B2 | 5/2014 | Ginetti |
| 8,732,640 B1 | 5/2014 | Krishnan |
| 8,762,906 B2 | 6/2014 | Ginetti |
| 8,782,577 B2 | 7/2014 | Fischer |
| 8,930,878 B1 | 1/2015 | Leef |
| 9,092,586 B1 | 7/2015 | Ginetti |
| 9,129,081 B2 | 9/2015 | Ginetti |
| 9,141,746 B1 | 9/2015 | Ginetti |
| 9,208,273 B1 | 12/2015 | Morlat |
| 9,223,915 B1 * | 12/2015 | Ginetti .................. G06F 30/33 |
| 9,245,073 B2 | 1/2016 | Fu |
| 9,280,621 B1 | 3/2016 | Ginetti |
| 9,286,421 B1 | 3/2016 | Kukal |
| 9,317,638 B1 | 4/2016 | Banka |
| 9,342,647 B2 | 5/2016 | Chen |
| 9,390,218 B2 | 7/2016 | Lee |
| 9,449,130 B1 | 9/2016 | Kukal |
| 9,542,084 B1 | 1/2017 | Colancon |
| 9,645,715 B1 | 5/2017 | Jain |
| 9,684,748 B1 | 6/2017 | Badel |
| 9,761,204 B1 | 9/2017 | Ginetti |
| 9,773,082 B1 | 9/2017 | Morlat |
| 9,779,193 B1 | 10/2017 | Ginetti |
| 9,798,840 B1 | 10/2017 | Ginetti |
| 9,830,417 B1 | 11/2017 | Ginetti |
| 9,842,183 B1 | 12/2017 | Ginetti |
| 9,881,119 B1 | 1/2018 | Kukal |
| 10,078,715 B2 | 9/2018 | Sendig |
| 10,102,324 B2 | 10/2018 | Oriordan |
| 10,289,793 B1 | 5/2019 | Kukal |
| 10,331,841 B1 | 6/2019 | Ginetti |
| 10,467,370 B1 * | 11/2019 | Kukal .................. H05K 3/0005 |
| 10,496,772 B1 | 12/2019 | Ginetti |
| 10,558,780 B1 * | 2/2020 | Kukal .................. G06F 30/398 |
| 10,678,978 B1 * | 6/2020 | Kukal .................. G06F 30/367 |
| 2003/0070150 A1 | 4/2003 | Allen et al. |
| 2003/0229873 A1 | 12/2003 | Casavant |
| 2004/0015338 A1 | 1/2004 | Lawrence |
| 2004/0054974 A1 | 3/2004 | Acar |
| 2004/0111688 A1 | 6/2004 | Lee |
| 2004/0156322 A1 | 8/2004 | Mehra |
| 2004/0158421 A1 | 8/2004 | Iwanishi |
| 2006/0225009 A1 | 10/2006 | Reddy |
| 2007/0094622 A1 | 4/2007 | Lee |
| 2007/0233443 A1 | 10/2007 | Lai |
| 2007/0277131 A1 | 11/2007 | Schaeffer |
| 2008/0163145 A1 | 7/2008 | Zarkesh-Ha |
| 2008/0244501 A1 | 10/2008 | Davison |
| 2008/0313581 A1 | 12/2008 | Gernhoefer |
| 2009/0112550 A1 | 4/2009 | Aikawa |
| 2009/0228851 A1 | 9/2009 | Abbaspour |
| 2009/0265672 A1 | 10/2009 | Ian et al. |
| 2010/0205575 A1 | 8/2010 | Arora |
| 2011/0035203 A1 | 2/2011 | Dalton |
| 2012/0023471 A1 | 1/2012 | Fischer |
| 2012/0324408 A1 | 12/2012 | Shacham |
| 2013/0097572 A1 | 4/2013 | Ginetti |
| 2015/0269297 A1 | 9/2015 | Tuan |
| 2016/0125115 A1 | 5/2016 | Strang |
| 2016/0147908 A1 | 5/2016 | Ni |
| 2017/0061059 A1 | 3/2017 | Gregerson |
| 2017/0169146 A1 | 6/2017 | Chen |
| 2017/0169156 A1 | 6/2017 | Perez |
| 2017/0249400 A1 | 8/2017 | Oriordan |
| 2017/0249410 A1 | 8/2017 | Baker |
| 2017/0255742 A1 | 9/2017 | Lee |

* cited by examiner

```
//pspice dspf
subckt EF_PA_ostg RFIN RFOUT inh_bulk_n
    Q38 (vcc! net104 net54 inh_bulk_n) npnStd area=10
    Q37 (net104 net108 net57 inh_bulk_n) npnStd area=5
    Q28 (net58 RFIN net92 inh_bulk_n) npnStd area=100
    L6 (net43 RFIN) inductor l=13n
```

```
subckt EF_Example_mid4 RFIN RFOUT inh_bulk_n
    I1 (RFIN RFOUT inh_bulk_n) EF_PA_ostg
    L17 (net4 net3) inductor l=1n
    L16 (net6 net5) inductor l=1n
    L15 (net8 net7) inductor l=1n
    L14 (net10 net9) inductor l=1n
    L13 (net12 net11) inductor l=1n
    L12 (net14 net13) inductor l=1n
    L11 (net16 net15) inductor l=1n
```

```
subckt EF_Example_mid3 RFIN RFOUT inh_bulk_n
    I1 (RFIN RFOUT inh_bulk_n) EF_Example_mid4
    L17 (net4 net3) inductor l=1n
    L16 (net6 net5) inductor l=1n
    L15 (net8 net7) inductor l=1n
    L14 (net10 net9) inductor l=1n
    L13 (net12 net11) inductor l=1n
```

```
M2 ( net03 net04) nport file="./model2.s2p"
ends EF_Example_old
// End of subcircuit definition.

// Library name: rfExamples
// Cell name: EF_PA_1stg
// View name: schematic
// Inherited view list: spectre cmos_sch cmos.sch schematic ve
//pspice dspf
subckt EF_PA_1stg RFIN RFOUT inh_bulk_n
    Q36 (RFOUT RFIN net24 inh_bulk_n) npnStd area=25
    Q37 (net6 net8 net22 inh_bulk_n) npnStd area=5
    Q38 (vcc! net6 net18 inh_bulk_n) npnStd area=10
    I8 (vcc! net6) isource dc=2m type=dc
    R34 (inh_bulk_n net24) resistor r=30
    R60 (vcc! RFOUT) resistor r=50
    R51 (inh_bulk_n net22) resistor r=200
    R33 (net18 net20) resistor r=200
    R53 (net8 net18) resistor r=1K
    R52 (inh_bulk_n net18) resistor r=1K
    L6 (net20 RFIN) inductor l=13n
ends EF_PA_1stg
// End of subcircuit definition.
R1 ( net07 net08) nport file="./model.s2p"
simulatorOptions options reltol=1e-3 vabstol=1e-6 iabstol=1e-12
    tnom=27 scalem=1.0 scale=1.0 gmin=1e-12 rforce=1 maxnotes=
    digits=5 cols=80 pivrel=1e-3 sensfile="../psf/sens.output"
    checklimitdest=psf
modelParameter info what=models where=rawfile
element info what=inst where=rawfile
outputParameter info what=output where=rawfile
designParamVals info what=parameters where=rawfile
primitives info what=primitives where=rawfile
subckts info what=subckts where=rawfile
saveOptions options save=allpub
ahdl_include "/servers/cic_vse/diwakarm/cds/181main_29nov/lnx
ahdl_include "/servers/cic_vse/diwakarm/cds/181main_29nov/lnx
```

METHODS, SYSTEMS, AND COMPUTER PROGRAM PRODUCT FOR CHARACTERIZING AN ELECTRONIC DESIGN WITH A SCHEMATIC DRIVEN EXTRACTED VIEW

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Modern electronic design is typically performed with computer aided design (CAD) tools or electronic design automation (EDA) systems. To design an integrated circuit, a designer first creates high level behavior descriptions of the IC device using a high-level hardware design language (HDL). Common examples of HDLs include Verilog and VHDL. An EDA system typically receives the high-level behavioral descriptions of the IC device and translates this high-level design language into netlists of various levels of abstraction. Essentially, the process to implement an electronic device begins with functional design and verification (e.g., using RTL or register-transfer level), and then proceeds to physical design of a layout and verification.

Circuit designers and verification engineers use different methods to verify circuit designs. One common method of verification is the use of simulation. Simulation dynamically verifies a design by monitoring behaviors of the design with respect to test stimuli. For many types of designs, simulation can and should be performed during the design process to ensure that the ultimate goals are achievable and will be realized by the finished product.

SPICE (Simulation Program with Integrated Circuit Emphasis) is a common type of simulator that is used to simulate and verify the operation of an electronic design. With SPICE, the electronic design is converted into a system of equation(s), which is then solved for a given set of inputs to check the state of specific portions of the circuit at given points in time. For many circuit designs, this process can be a very computationally expensive and time-consuming effort, especially given the size and complexity of modern circuit designs.

Conventional approaches for simulations, especially for board level simulations (e.g., simulations performed on an electronic system including the printed circuit board or PCB, one or more integrated circuit (IC) chips, and IC packaging thereof) often extract a static simulation view from the finished layout by identifying a corresponding schematic symbol from the schematic symbol library for each of a plurality of layout circuit devices. As a result, these simulation views are often termed layout extracted views or simply extracted views. The electronic design may then undergo multiple rounds of changes to the schematic, the layout, or both the schematic and the layout after the initial simulation has been performed with a simulation view extracted from the initial layout.

When these changes occur at the schematic level, these conventional approaches require a designer to implement the changes in the schematic of the electronic design, push these schematic changes to create an updated layout with a layout editor, and then extract an updated simulation view with the updated layout. The simulator may then perform another round of simulation with the updated simulation view. This loop not only requires much more time and computational resources but also presents multiple other problems.

For example, modern electronic design may include devices having distributed pins, vector pins, etc. that may be represented as an input pin in the schematic symbol. During a simulation of, for example, an electronic design with a distributed Vcc having multiple Vcc pins for a distributed power network, this distributed Vcc may be schematically represented as a single Vcc pin in the corresponding schematic symbol. In this example, if the simulation result for the Vcc shows abnormal behavior the designer will need to guess which Vcc pin or Vcc pins are causing the abnormal behavior or perform some trial-and-error changes to identify the true cause of the abnormal behavior. Similar problems and hence challenges also arise for vector pins which may be even more difficult to troubleshoot and identify the root source of any abnormal behavior simulation result due to the multiplicity of the pins.

Another problem with these conventional approaches is that the extracted view from a layout is a static view. These simulation views are generated by traversing a layout to identify layout component designs and devices, identify a corresponding schematic symbol for each of the layout component designs, place the schematic symbol in the simulation view, and interconnect the schematic symbols by referencing the layout connectivity. Although these simulation views may in some cases appear to be identical or substantially similar to the original schematic from which the layout is generated, these simulation views or extracted views may not be editable as the original schematic. As a result, any changes at the schematic level must go through the aforementioned schematic edit, layout edit, and re-extraction.

Moreover, these simulation views are often generated for the simulation engines and thus do not appear as readable or understandable by designers. More importantly, these extracted views are generated as a flat view having a single hierarchy that includes all the schematic symbols or models understood by the simulation engine. As a result, an extracted view loses the hierarchical structures of the electronic designs; and the loss of the hierarchical structure further exacerbates the difficulties in understanding or manipulating such an extracted view, even if the extracted view were to be editable.

Another problem with conventional approaches is that the same schematic symbol may correspond to multiple schematic instances in the schematic design and hence multiple layout instances in the layout. During the generation of an extracted view from the layout in conventional approaches, these multiple layout instances may be extracted and represented as the same schematic symbol whereas these multiple layout instances may not necessarily be identically implemented in the layout. For example, two or more of these multiple layout instances may be routed differently although then all correspond to the same schematic symbol. As a result, conventional simulation views cannot correct capture the differences in, for example, parasitics and/or electrical characteristics between these layout instances.

To further exacerbate the aforementioned problems and challenges, users may often desire to simulate IC (integrated circuit) within the context of a system design that spans across multiple design fabrics such as the IC chip design fabric, the IC package design fabric, and PCB (printed circuit board) design fabric, etc. The schematics of these individual designs (e.g., the IC designs, the PCB design, and the IC package design) may not always exist or available at the time of simulation. Even if the schematics do exist, these schematics may be available in different formats for different schematic tools. Often, these schematics may not include the required or desired information (e.g., parasitic information) for the simulations. Even if these schematics are available and include the desired or required information for each design fabric, the system schematic for the whole system design may still be lacking for simulations to be performed on the whole system design.

In addition, these individual schematics may be incompatible with each other and thus may not be simulated together. Customers would nevertheless like to simulate this system design within the context of parasitics of the chip layout, the IC package layout, and the PCB layout. These parasitic-models may be extracted as combined geometry across fabrics. Some examples of such models may include on-chip spiral inductor extracted in conjunction with the package planes and traces. In some cases, complete PCB (or IC package) may be extracted as a single extracted model that needs to connect to the remainder of the system. Nonetheless, it is very difficult to include parasitics from different design fabrics (e.g., different design fabrics in various layouts) in the simulation schematic.

Conventional approaches require manual creation of parasitic aware simulation schematics where a new schematic is manually created where PCB and Package components are stitched around the IC schematic. On the other hand, if PCB/Package schematics available in their native schematic editors, user has to copy the same schematics in the IC schematic entry tool. In some cases, if PCB/Package schematics do not exist, user has to construct new schematic by going through respective layouts to obtain the connectivity information (e.g., the port names, the net names, etc.) for each device.

In addition, an extracted model (e.g., a Spice model, an s-parameter model, etc.) needs to be manually constructed by drawing a boundary, manually determining the locations and identifiers for the ports, terminals, or pins in the an extracted model, and manually associating, attaching, stitching, or annotating properties (e.g., s-parameter properties, etc.) to the an extracted model. The system design spanning across multiple design fabrics further exacerbates the problem because a designer needs to invoke respective schematic editors and layout editors for corresponding design fabrics to identify a lot of information for the manual creation of an extracted model. Even if the designer manages to manually create such an extracted model, there is no way for the designer to check the correctness of the newly constructed extracted model.

Moreover, modifications of an extracted model can only be done by going through the same manual process as the construction of a new extracted model while the correctness of such modifications still cannot be checked. Moreover, if extracted models are extracted from portion of geometry that crosses multiple fabrics, then a designer must manually maintain a record of model interfaces and manually create the connections within and outside the newly constructed extracted model to ensure that the extracted model is properly connected and stitched into system schematic that spreads across the IC, the PCB and the IC package design fabrics to keep the whole system design in single schematic entry tool for purposes of simulations.

In addition, customers may often characterize an IC (integrated circuit) and/or an IC package having one or more ICs within the context of a system design that spans across multiple design fabrics such as the IC chip design fabric, the IC package design fabric, and PCB (printed circuit board) design fabric, etc. The schematics of these individual designs (e.g., the IC designs, the PCB design, and the IC package design) may not always exist or available at the time of simulation. Even if the schematics do exist, these schematics may be available in different formats for different schematic tools. Often, these schematics may not include the required or desired information (e.g., parasitic information) for the simulations. Even if these schematics are available and include the desired or required information for each design fabric, the system schematic for the whole system design may still be lacking for simulations to be performed on the whole system design.

In addition, these individual schematics may be incompatible with each other and thus may not be simulated together. Customers would nevertheless like to simulate this system design within the context of parasitics of the chip layout, the IC package layout, and the PCB layout. These parasitic-models may be extracted as combined geometry across fabrics. Some examples of such models may include on-chip spiral inductor extracted in conjunction with the package planes and traces. In some cases, complete PCB (or IC package) may be extracted as a single extracted model that needs to connect to the remainder of the system. Nonetheless, it is very difficult to include parasitics from different design fabrics (e.g., different design fabrics in various layouts) in the simulation schematic.

Conventional approaches require manual creation of parasitic aware simulation schematics where a new schematic is manually created where PCB and Package components are stitched around the IC schematic. On the other hand, if PCB/Package schematics available in their native schematic editors, user has to copy the same schematics in the IC schematic entry tool. In some cases, if PCB/Package schematics do not exist, user has to construct new schematic by going through respective layouts to obtain the connectivity information (e.g., the port names, the net names, etc.) for each device.

In addition, an extracted model (e.g., a SPICE model, an S-parameter model, etc.) needs to be manually constructed by drawing a boundary, manually determining the locations and identifiers for the ports, terminals, or pins in the extracted model, and manually associating, attaching, stitching, or annotating properties (e.g., s-parameter properties, etc.) to the extracted model. The system design spanning across multiple design fabrics further exacerbates the problem because a designer needs to invoke respective schematic editors and layout editors for corresponding design fabrics to identify a lot of information for the manual creation of an extracted model. Even if the designer manages to manually create such an extracted model, there is no way for the designer to check the correctness of the newly constructed extracted model.

Moreover, in conventional approaches, modifications of an extracted model can only be done by going through the same manual process as the construction of a new extracted model while the correctness of such modifications still cannot be checked. Moreover, if extracted models are extracted from portion of geometry that crosses multiple fabrics, then a designer must manually maintain a record of model interfaces and manually create the connections within and outside the newly constructed extracted model to ensure that the extracted model is properly connected and stitched into system schematic that spreads across the IC, the PCB and the IC package design fabrics to keep the whole system design in single schematic entry tool for purposes of simulations.

Conventional solutions only support electronic designs in a single design fabric but do not support an electronic design that spans across multiple design fabrics (e.g., an IC design fabric, an IC package design fabric, a PCB design fabric, etc.) Some modern approaches attempt to address this shortcoming of conventional approaches by creating as many hierarchical cell views as the number of hierarchies in the electronic design and also by creating multiple copies of the original schematic designs to the extracted schematic even if one or more portions of the electronic design of interest are not extracted.

Furthermore, these modern approaches create extracted model instances (e.g., s-parameter model instance(s), IBIS model instance(s), SPICE model instance(s), etc.) at any hierarchical level of the electronic design of interest so if multiple model instances are to be stitched the stitched result may be created (e.g., instantiated) at different hierarchical levels in a hierarchical extracted view hierarchy. As a result, in these modern approaches, it is more than a challenge for a user (e.g., a designer, a verification engineer, etc.) to identify at which hierarchical level in the hierarchical extracted view a particular model instance is instantiated. This challenge leads to a further, greater challenge for the user to switch the remainder of the hierarchical extracted view to simulatable models. In addition to the aforementioned shortcomings, these modern approaches for creating hierarchical extracted views also do not support occurrence-based models. To further exacerbate the situation, these modern hierarchical approaches generate multiple copies of the entire design hierarchy for each of the PCB, IC package, and IC schematics and generate an extracted view with models (e.g., s-parameter model(s), IBIS model(s), SPICE model(s), etc.) across the entire hierarchical structure of the electronic design of interest.

Another school of modern approaches generate a flat extracted view for an electronic design of interest. These approaches support only one design fabric but do not support an electronic design spanning across multiple design fabrics. These approaches non-selectively flatten the entire electronic design in a single design fabric to generate a flat extracted view and thus elevate all model instances (e.g., s-parameter model instance(s), IBIS model instance(s), SPICE model instance(s), etc.) Similar to the aforementioned hierarchical approaches, it is also a challenge for a user to identify at which level in the original hierarchical electronic design a specific model instance is instantiated.

In addition, these flat approaches (that flatten all the hierarchies in a design fabric into a single extracted view) inevitably cause data explosion problems because these flat approaches flatten everything to the top hierarchy and instantiate only the simulator primitive level components (e.g., MOS devices, resistors, capacitors, etc.), whereas simulation models for intermediate level(s) (e.g., a design block) cannot be used because these simulation models at the intermediate level(s) are also non-selectively flattened to the top level (and the only level) in the extracted view.

To further exacerbate these nearly insurmountable difficulties, these flat approaches non-selectively flatten an entire electronic design in a single design fabric even when only one object (e.g., a net) spanning across multiple design hierarchies needs to be extracted, and if the deigns object spans across multiple design fabrics, the entire design at each of these multiple design fabrics needs to be flattened. These flat approaches also commingle technology information for deigns components with different technologies. This commingling of technology information of different technologies leads to another problem with assigning correct models to corresponding circuit blocks. Furthermore, an electronic design spanning across multiple design fabrics cannot be simply be merged into a single representation because different design fabrics may correspond to different technology PDKs (process design kits).

Thus, what are needed are methods, systems, and computer program products for characterizing a multi-fabric electronic design with an extracted view in a more efficient and effective manner and to address at least the aforementioned issues and shortcomings.

SUMMARY

Disclosed are method(s), system(s), and article(s) of manufacture for characterizing an electronic design with a schematic driven extracted view in one or more embodiments. Some embodiments are directed at a method for implementing schematic driven extracted views for an electronic design. These embodiments identify a schematic of an electronic design, wherein the schematic exists in one or more design fabrics. These techniques further determine an extracted model for characterizing a behavior of the electronic design based at least in part upon the schematic, determine a hierarchical level in a design fabric of the one or more design fabrics of the schematic, and characterize the electronic design with at least an extracted view.

Some embodiments are directed at a hardware system that may be invoked to perform any of the methods, processes, or sub-processes disclosed herein. The hardware system may include at least one microprocessor or at least one processor core, which executes one or more threads of execution to perform any of the methods, processes, or sub-processes disclosed herein in some embodiments. The hardware system may further include one or more forms of non-transitory machine-readable storage media or devices to temporarily or persistently store various types of data or information. Some exemplary modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some exemplary forms of the non-transitory machine-readable storage media may also be found in the System Architecture Overview section below.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIG. 3C illustrates an example netlist for the extracted view with a model for the electronic illustrated in FIG. 3A.

FIG. 3F illustrates an example netlist for the single extracted view modified with an extracted model and a simulation model for the electronic illustrated in FIG. 3A by using some of the techniques described herein in one or more embodiments.

FIG. 4C illustrates an example netlist of the example approach illustrated in FIG. 4B.

FIG. 6C illustrates an example netlist for the extracted views generated for each of the hierarchical levels in the example electronic design illustrated in FIG. 6A.

DETAILED DESCRIPTION

Figure 1A:
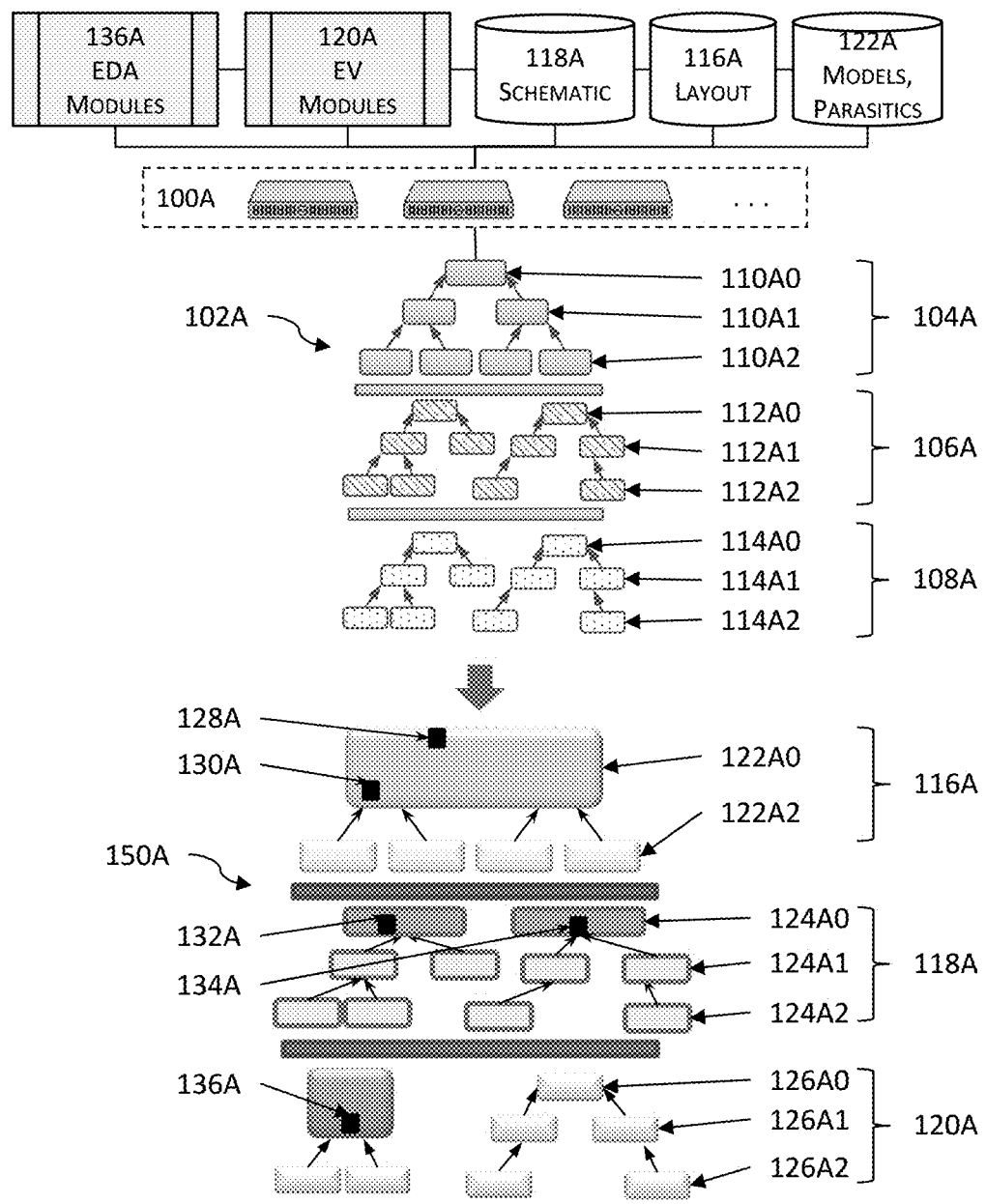
FIG. 1A illustrates a high-level block diagram of a simplified system for characterizing an electronic design with a schematic driven extracted view in one or more embodiments.

Various embodiments described herein are directed to implementing schematic driven extracted views for an electronic design in various embodiments. Rather than creating a respective extracted view (a simulation view, a cell view, or simply a view; collectively referred to as an extracted view) for each hierarchy by non-selectively flattening each hierarchy in an electronic design when accommodating a model (e.g., a SPICE model, an IBIS model, an S-parameter model, a Y-parameter model, a Z-parameter model, an H-parameter model, a T-parameter model, an ABCD-parameter model, etc.), various embodiments described herein determines one hierarchical level based at least in part upon the model to be incorporated.

Once the one or more hierarchical levels in the electronic design of interest have been determined, various embodiments flatten these one or more hierarchical levels while leaving the remaining hierarchical level(s) in the electronic design of interest unchanged. Various embodiments further identify the circuit component design(s) that corresponds to the model to be incorporated based at least in part upon connectivity information and/or the hierarchical structure of the electronic design. A single, extracted view may be created by identifying the circuit components designs in the one or more flattened hierarchical levels, identifying the original schematic designs for the remaining hierarchical level(s), and inserting and interconnecting the model in the single extracted view.

The single extracted view may be further optionally modified by inserting a simulation model has been created for a hierarchical block of circuit components in a non-flattened portion of the single extracted view and/or for a particular simulation engine (e.g., a commercially available simulator, a proprietary simulator, etc.) in some embodiments. In these embodiments, the simulation model may be bound with or associate with the hierarchical block of circuit components by using a pointer, a symbolic link, or any other suitable link structure to link the simulation model to the hierarchical block of circuit components. In some of these embodiments, the simulation model may be incorporated into the single extracted view in place of or in addition to the hierarchical block of circuit components. In some of these embodiments where the simulation model is incorporated into the single extracted view, the original hierarchical block or the simulation model may be deemphasized in the user interface to reduce the clutter of the extracted view in the user interface.

One of the advantages of various embodiments described herein is that some embodiments described herein create a single extracted view for an electronic design by selectively flattening only the hierarchical level(s) in a schematic design pertaining to an extracted model to be incorporated. Some embodiments described herein preserve the remaining hierarchical level(s) in their respective schematic design(s) of the electronic design of interest. These embodiments thus flatten only the hierarchical level(s) pertaining to an extracted model of interest while referencing the original schematic design(s) for the remaining hierarchical level(s) and thus create a single extracted view for the entire electronic design of interest.

Moreover, these embodiments creating a single extracted view are in sharp contrast with conventional approaches that create an extracted view for each hierarchical level of a plurality of hierarchical levels in a modern electronic design. This creation of a single extracted view not only avoids the explosion of data and unnecessary waste of computing resources (e.g., in terms of storage and processing of such multiple extracted views) but also provide several additional advantages.

For example, the single extracted view may be generated by selectively flattening one or more hierarchical levels pertaining to an extracted model of interest while preserving the original schematic design(s) for the remaining hierarchical levels. As a result, the netlist corresponding to the single extracted view is much smaller that those created by conventional approaches that create a respective extracted view for each of a plurality of hierarchical levels.

Another advantage is that with the aid of addition information (e.g., schematic and/or layout connectivity information), the extracted model of interest may be easily identified and incorporated into the shorter netlist. In contrast, conventional approaches generate as many extracted views as there are for the number of hierarchical levels in an electronic design. It is much more difficult to identify which extract views are to be affected by the incorporation of an extracted model, let alone identifying which part of the much longer (longer due to, for example, non-selective flattening of all hierarchies) netlist is to be affected by the incorporation of the extracted model. These difficulties are especially exacerbated when an extracted model of interest span across multiple hierarchies or even multiple design fabrics.

In addition, another advantage is that by selectively flattening one or more hierarchical levels pertaining an extracted model of interest while preserving the remaining hierarchical level or levels by, for example, referencing the original schematic design or designs for the remaining hierarchical level or levels without flattening, some embodiments enable the reuse of a simulation model that has been built for a particular hierarchical block (e.g., a macro, an intellectual property or IP block, etc.) in an original schematic. This reuse of simulation models has proven to be extremely difficult, if not impossible, in conventional approaches because conventional approaches non-selectively flatten hierarchical levels that do not even pertain to an extracted model to be incorporated for characterizing the electronic design of interest, and such non-selective flattening in an extracted view may simply lose the correspondence between a hierarchical schematic block of circuit components and the corresponding simulation model.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

FIG. 1A illustrates a high-level block diagram of a simplified system for characterizing an electronic design with a schematic driven extracted view in one or more embodiments. In these embodiments, a schematic design of an electronic design 102A having one or more hierarchical levels in each of a plurality of design fabrics may be provided to one or more computing systems 100A.

In this example illustrated in FIG. 1A, these one or more computing systems 100A invoke various tools and/or modules to generate a single extracted view 150A for this electronic design 102A. More specifically, the electronic design 102A may include a first schematic design having hierarchical levels 110A0, 110A1, and 110A2 in a first design fabric (e.g., a printed circuit board or PCB design fabric) 104A, a second schematic design having hierarchical levels 112A0, 112A1, and 112A2 in a second design fabric (e.g., an IC package design fabric) 106A, and a third schematic design having hierarchical levels 114A0, 114A1, and 114A2 in a third design fabric (e.g., an IC design fabric) 104A.

To create an extracted view for a simulation module, a single extracted view is to be created to incorporate a first extracted model 128A into the hierarchical level 0 (110A0) of the first schematic design and incorporate a second extracted model 130A into the hierarchical level 1 (110A1) of the first schematic design in the first design fabric 104A. In addition, a third extracted model 132A and a fourth extracted model 134A are to be incorporated into the first hierarchical level (112A0) in the second schematic design in the second design fabric 106A. Furthermore, a fifth extracted model 136A is to be incorporated into the second hierarchical level (114A1) in the third design fabric (108A).

With these extracted models (128A, 130A, 132A, and 134A), some embodiments may determine that the first hierarchical level (110A0) and the second hierarchical level (110A1) in the first design fabric (104A), the first hierarchical level (112A0) of the second design fabric (106A), and the second hierarchical level (114A1) of the third design fabric (108A) are to be flattened, while the remaining hierarchical levels (110A2, 112A1, 112A2, 114A0, and 114A2) are preserved and not flattened.

A single extracted view 150A may thus be created. In this example illustrated in FIG. 1A, the first hierarchical level (110A0) and the second hierarchical level (110A1) in the first design fabric (104A) are flattened to form the first hierarchical level 122A0 in the first design fabric (116A) of the single extracted view 150A; the first hierarchical level (112A0) of the second design fabric (106A) is also flattened for the first hierarchical level (124A0) in the second design fabric (118A) of the single extracted view 150A; and the second hierarchical level (114A1) of the third design fabric (108A) is also flattened into the first hierarchical level (126A0) in the third design fabric (120A) of the single extracted view 150A.

The remaining hierarchies in the single extracted view 150A may be determined by referencing the corresponding schematic designs at the corresponding hierarchies without flattening these remaining corresponding schematic designs at the corresponding hierarchies. For example, the third hierarchical level 110A2 in the first design fabric 104A is not flattened. Therefore, the original schematic design corresponding to the third hierarchical level 110A2 may be referenced in the creation of the corresponding hierarchical level (122A2) for the first deign fabric (116A) of the single extracted view 150A. Similarly, the second hierarchical level (112A1) and the third hierarchical level (112A2) in the second design fabric 106A are also not flattened in the creation of the single extracted view 150A. Therefore, the original schematic designs respectively corresponding to the second hierarchical level (112A1) and the third hierarchical level (112A2) may also be referenced in the creation of the corresponding hierarchical levels (124A1 and 124A2) for the second design fabric (118A) of the single extracted view 150A.

Moreover, the third hierarchical level (114A2) in the third design fabric 108A is not flattened in the creation of the single extracted view 150A. Therefore, the original schematic design corresponding to the third hierarchical level (114A2) may also be referenced in the creation of the third hierarchical level (126A2) for the third design fabric (120A) of the single extracted view 150A. In addition, the example illustrated in FIG. 1A illustrates two instances in the third design fabric (108A) where only the left instance is to be modified with the fifth extracted model (136A), and the right instance remains unchanged. In this example, the original schematic designs at the first (114A0), the second (114A1), and the third (114A2) hierarchical level may be referenced in the creation of the corresponding levels (126A0, 126A1, and 126A2) of the single extracted view 150A in the third design fabric (120A).

With the five extracted models (128A, 130A, 132A, 134A, and 136A), the single extracted view 150A may then be forwarded to a simulation engine (not shown) for characterizing the underlying electronic design 102A.

Each of these modules (e.g., 136A, 120A, etc.) may be implemented as a pure hardware implementation (e.g., in the form of firmware, application specific IC, etc.), a pure software implementation, or a combination of hardware and software implementation. In some embodiments where a module is implemented at least partially as a software implementation, the module may be stored at least partially in memory (e.g., in random access memory, instruction cache, etc.) of at least one of these one or more computing systems 100A for execution.

These modules may include one or more EDA (electronic design automation) modules 136A such as a schematic tool, a placement tool, a routing tool, verification tools, post-route or post-layout optimization tools, various photolithography tools (e.g., optical proximity correction or OPC tools, phase shift mask or PSM tools, resolution enhancement technology or RET tools, etc.), etc. to prepare the electronic design for finalizing the electronic design for mask preparation and mask writing as well as for tapeout for the eventual manufacturing of the electronic circuits represented by the electronic design.

These modules may also include one or more extracted view modules 120A that may include, for example, 3D and/or 2.5D modeling tools to model various components in the 3D or 2.5D space, extraction modules to extract geometric, physical, and/or electrical characteristics, properties, or attributes from various sources (e.g., layouts, SEM or scanning electron microscope photos, etc.), meshing module(s) to discretize an area or a volume into a plurality of meshes, and/or one or more geometry simplification or reduction modules to simplify geometries by approximating more complex geometries with simpler geometries (e.g., by approximating a curve with a plurality of straight segments depending upon the resource requirements and/or the accuracy requirements).

These one or more extracted view modules 120A may also include one or more EM (electromagnetic) field solver modules, heuristic solver modules, and/to empirical formula solver modules to solve for the electrical behavior of an underlying electronic circuit. These one or more extracted view modules 120A may further include a pre-layout exploration module that estimates the characteristics, attributes, and/or properties of a circuit component design, without invoking any layout editors.

These one or more computing systems 100A may further access one or more schematic design databases 118A (e.g., an IC schematic database, an IC package schematic database, a PCB schematic database, etc.) and/or one or more layout databases 116A (e.g., an IC layout database, an IC package layout database, a PCB layout database, etc.) when generating an extracted view from one or more schematic designs (e.g., an IC schematic, an IC package schematic design, a PCB schematic design, etc.) of an electronic design.

A plurality of extracted models (e.g., SPICE sub-circuits, IBIS models, s-parameter models, etc.), one or more simulation models (e.g., a model for a hierarchical block of schematic design components), and/or parasitic data 122A may also be stored and made available to these one or more computing systems. For example, some embodiments may store parasitic data of some parameterized, pre-existing, or pre-characterized electronic circuit component designs in a tabular structure (e.g., a database) so that these one or more computing systems, when modeling an electronic circuit component design as model in an extracted view, may look up the parasitic data, model data, or even a parameterized model for a substantially similar or previously characterized electronic circuit component design so that these one or more computing systems 100A no longer need to expend as much or any computational resources in constructing the model for the electronic circuit component design.

Figure 1B:
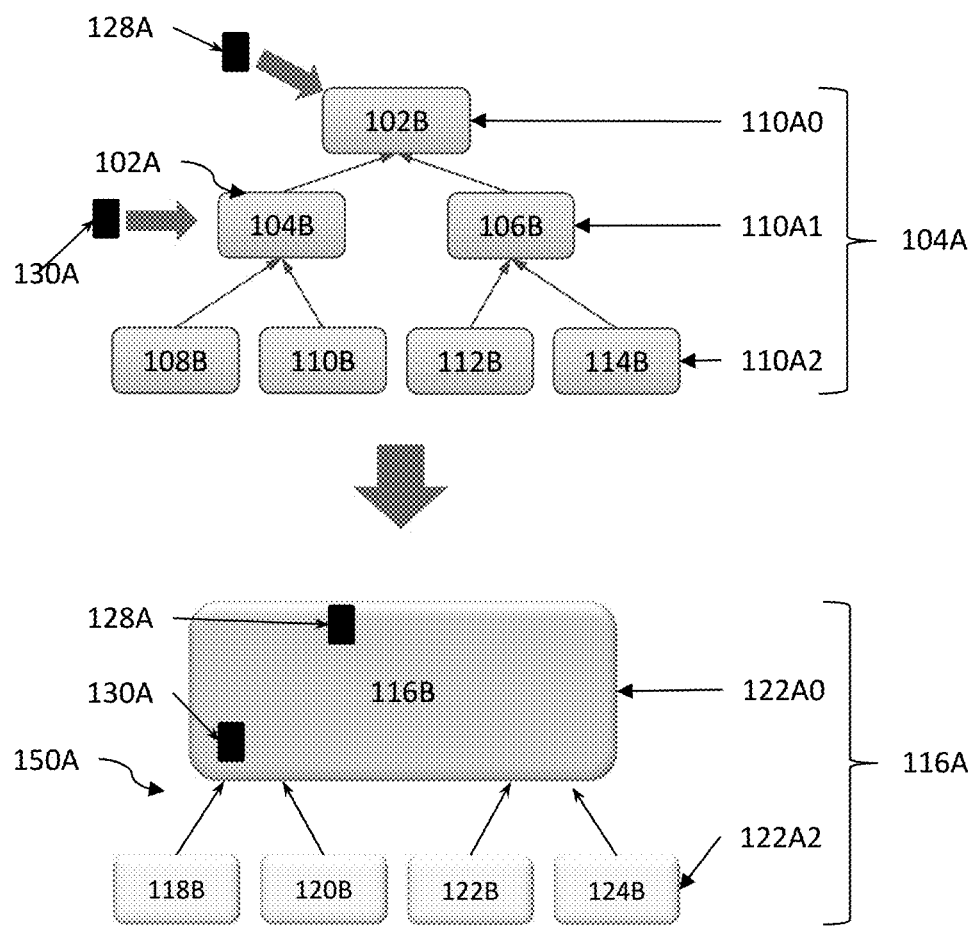
FIG. 1B illustrates an example hierarchical structure of a cross-fabric schematic design and an example extracted view created by using some techniques described herein in some embodiments.

FIG. 1B illustrates an example hierarchical structure of a cross-fabric schematic design and an example extracted view created by using some techniques described herein in some embodiments. More specifically, FIG. 1B illustrates more details about the first design fabric (104A) in the schematic design 102A and the corresponding first design fabric (116A) in the single extracted view 150A in FIG. 1A.

The schematics of the electronic design 102A includes the first schematic level (110A0), a second schematic level (110A1), and a third schematic level (110A2). A first extracted model 128A is to be incorporated into an instance 102B at the first schematic level (112A0); and a second extracted model (130A) is to be incorporated into instance 1046 at the second schematic level (110A1). For the first design fabric 104A, some embodiments may determine that the first (110A0) and the second (110A1) schematic levels are to be flattened for the incorporation of the extracted models (128A and 130A). Therefore, an extracted view module (e.g., 120A in FIG. 1A) may generate a single extracted view (e.g., 150A in FIG. 1A) that includes the first portion 116B at the first level 122A0 that corresponds to the flattened first (110A0) and second (110A1) schematic level and second portions (118B, 120B, 122B, and 124B) at the second level (122A2) that respectively reference the original schematic designs 108B, 1106, 112B, and 114B.

Unlike conventional, these embodiments do not create separate extracted views for different hierarchical levels. Rather, these embodiments create a single extracted view by selectively flattening the hierarchical levels (110A0 and 110A1) pertaining to the extracted models (128A and 130A) while preserving the remaining hierarchical level (110A2) that does not pertain to the extracted models (128A and 130A) without flattening the remaining hierarchical level (110A2). Some of these embodiments selectively flatten the entire hierarchical level pertaining to an extracted model, while some other embodiments partially flatten only the portion of the hierarchical level pertaining to the extracted model.

For example, regarding the hierarchical level 110A2 that has been determined to pertain to the extracted model 130A, some of these embodiments may flatten both instance 104B and instance 106B, whereas some other embodiments may flatten only instance 104B while preserving instance 1066 so that during the creation of the single extracted view 150A, all the schematic circuit components of instance 104B are flattened into the hierarchical level 122A0 in the single extracted view 150A, but the original schematic design for instance 1066 is referenced in the creation of the single extracted view 150A without flattening instance 1066.

Figure 1C:
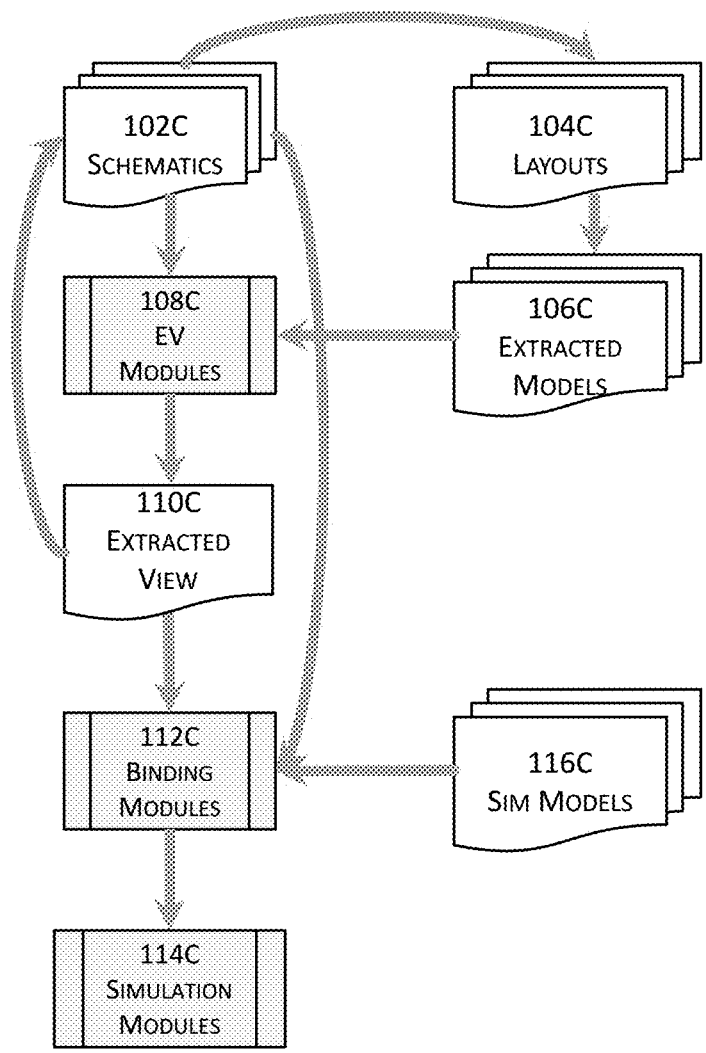
FIG. 1C illustrates an example process flow for characterizing an electronic design with a schematic driven extracted view in some embodiments.

FIG. 1C illustrates an example process flow for characterizing an electronic design with a schematic driven extracted view in some embodiments. In these embodiments, one or more schematics 102C are provided to one or more extracted view modules 108C. In some of these embodiments, schematic designs (102C) in different design fabrics respectively correspond to different extracted view modules (108C). In some other embodiments, an extracted view module (102C) processes schematic designs in multiple design fabrics.

These one or more extracted view modules (108C) generate a single extracted view (110C) from the one or more schematic designs (102C) so that the single extracted view (110C) constitutes a schematic-driven extracted view. This extracted view (102C) is thus different from a layout-driven extracted view generated by some conventional approaches. These conventional approaches generate a layout-driven extracted view by, for example, traversing a layout to identify layout component designs and devices, identifying a corresponding schematic symbol for each of the layout component designs, placing the schematic symbol in the simulation view, and interconnecting the schematic symbols by referencing the layout connectivity.

A layout-driven extracted view is far inferior than a schematic-driven extracted view described herein in many aspects. One of the major disadvantages of a layout-driven extracted view is that a change at the schematic level requires a designer make a corresponding change in the schematic and push the corresponding schematic change to the layout before the layout-driven extracted view may be updated. Moreover, these layout-driven extracted views are often generated for the simulation engines and thus do not appear as readable or understandable by users. In addition, a layout-driven extracted view is generated as a flat view having a single hierarchy that includes all the schematic symbols or models understood by the simulation engine. As a result, a layout-driven extracted view loses the hierarchical structures of the electronic designs; and the loss of the hierarchical structure further exacerbates the difficulties in understanding or manipulating such a layout-driven extracted view, even if the layout-driven extracted view were to be editable.

An extracted view module (108C) may also receive an extracted model (106C) that may be used in the creation of a schematic-driven extracted view. For an extracted model (106C) representing a set of circuit components, an extracted view module (108C) may place and interconnect the extracted model (106C) in an extracted view (110C) in place of or in addition to the set of circuit components. An extracted model (106C) may be generated via, for example, extraction of one or more model parameters (e.g., SPICE parameters, S-parameters, etc.) from a layout (104C) that corresponds to a schematic design (102C). For example, an extracted model (106C) of a MOS (metal-oxide semiconductor) device may be extracted from the corresponding portion of an IC layout (104C).

In some embodiments where one or more hierarchical levels in the schematic design (102C) are selectively flattened into an extracted view while the remaining hierarchical levels are preserved, a binding module (112C) may identify a simulation model (116C) that has been constructed to represent a set of schematic circuit components (e.g., a hierarchical block) in a remaining hierarchical level and generate an updated extracted view by binding or associating this simulation model (116C) with the set of schematic circuit components in the remaining hierarchical level that is preserved in the extracted view (110C). A simulation model (116C) thus constructed is recognized and understood by a simulation engine to simulate the behaviors of the corresponding set of schematic circuit components.

A simulation model (116C) may be bound to a corresponding set of schematic circuit components in many different ways. For example, an extracted view may reference a simulation model for a set of schematic circuit components in some embodiments; or a simulation model may be inserted into an extracted view in place of or in addition to the corresponding set of schematic circuit components in some other embodiments. This updated extracted view having one or more extracted models (106C) and bound with one or more simulation models (116C) may be provided to a simulation module (114C) that performs one or more analyses on the updated extracted view to characterize the underlying electronic design.

Figure 1D:
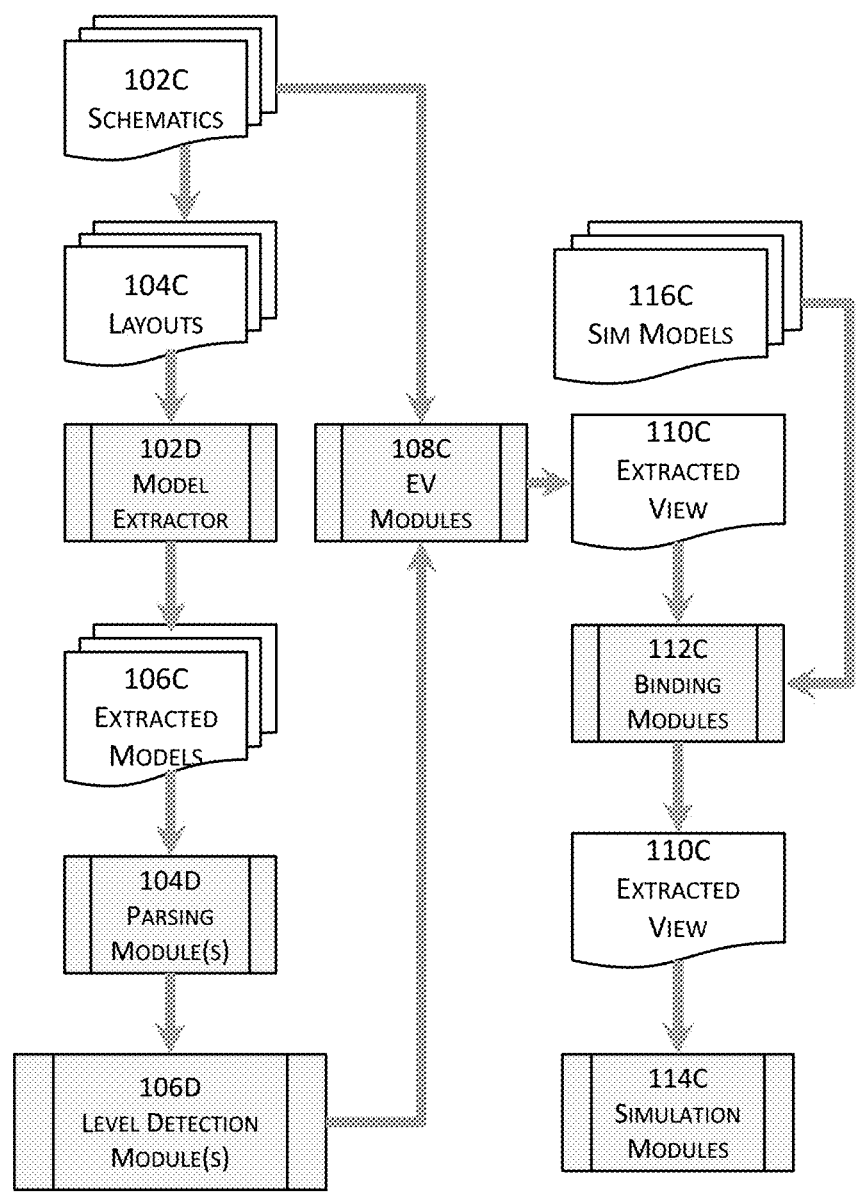
FIG. 1D illustrates another example process flow for characterizing an electronic design with a schematic driven extracted view in some embodiments.

FIG. 1D illustrates another example process flow for characterizing an electronic design with a schematic driven extracted view in some embodiments. More specifically, FIG. 1D illustrates more details about the example process flow illustrated in FIG. 1C. In these embodiments illustrated in FIG. 1D, extracted models (106C) may be extracted or constructed by one or more model extractors (102D). For example, an S-parameter extractor may extract one or more S-parameters of a device and construct a behavioral representation (e.g., an S-parameter model) with these one or more S-parameters to represent the behavior of a passive circuit component (e.g., an interconnect). As another example, an IBIS (Input/output Buffer Information Specification) extractor may construct an IBIS model from simulation and/or bench measurement data to represent the behavior of an active circuit component (e.g., a transistor).

Moreover, an extracted model (106C) may be provided to a parsing module (104D) that parses the extracted model and stores the model information (e.g., port/terminal identifications, etc.) for the creation of an extracted view with the extracted model. A level detection module (106D) may further process an electronic design of interest based in part or in whole upon an extracted model (106C) and/or the context of the hierarchical structure of the electronic design to determine one or more hierarchical levels that pertain to the extracted model (106C). These one or more hierarchical levels may be subject to flattening by an extracted view module (108C) for the creation of an extracted view.

A level detection module (106D) may further determine one or more design fabrics that pertain to an extracted model (106C). For example, a level detection module (106D) may determine whether an extracted model (106C) is entirely located within a single design fabric or spans across multiple design fabrics. A level detection module (106D) may perform these functions either by itself or in conjunction with one or more other modules (e.g., via one or more IPCs or inter-process calls to one or more schematic editors for one or more design fabrics, one or more layout editors for one or more design fabrics, etc.) to facilitate the performance of level and/or design fabric determination described above. The one or more hierarchical levels and/or one or more design fabrics determined by a level detection module (106D) may be provided to or referenced by an extracted view module (108C) for the creation of an extracted view (110C) for the underlying electronic design.

Figure 1E:
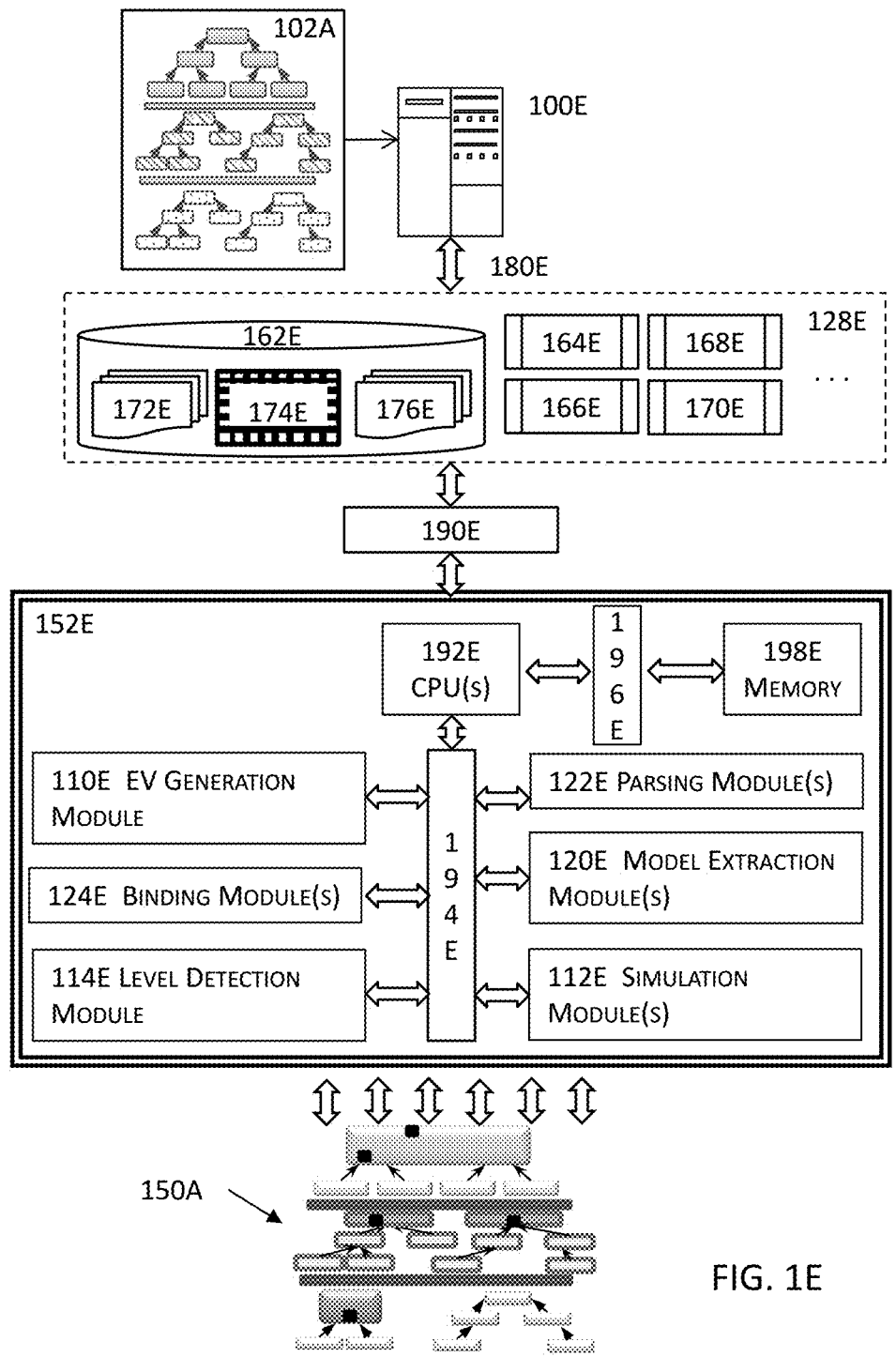
FIG. 1E illustrates a high-level diagram of a simplified system for characterizing an electronic design with a schematic driven extracted view in one or more embodiments.

FIG. 1E illustrates a high-level diagram of a simplified system for characterizing an electronic design with a schematic driven extracted view in one or more embodiments. More specifically, the computing system 100E in FIG. 1E may comprise one or more physical computing systems or virtual machines 100E, such as a general-purpose computer described in the System Architecture Overview section to implement one or more special proposes. The illustrative system in FIG. 1E may include an Internet-based computing platform providing a shared pool of configurable computer processing resources (e.g., computer networks, servers, storage, applications, services, etc.) and data to other computers and devices in a ubiquitous, on-demand basis via the Internet. For example, one or more computing resources and/or modules illustrated in FIG. 1E may be located in a cloud computing platform in some embodiments.

In this illustrated system in FIG. 1E, one or more computing systems 100E may invoke and execute various modules to identify an electronic design 102A (e.g., a schematic design including one or more hierarchical levels in one or more design fabrics, etc.) The one or more computing systems 100E may invoke and execute a plurality of modules, which are specifically programmed and stored at least partially in memory of and functions in conjunction with at least one microprocessor (e.g., 192E) or processor core of the one or more computing systems 100E, to perform various functions to generate a single extracted view 150A for the electronic design 102A.

For example, the one or more computing systems 100E may execute a extracted view generation module (110E) that automatically generates a single extracted view with one or more extracted models from the schematic design of an electronic circuit at least by selectively flattening one or more hierarchical levels pertaining to the one or more extracted models while preserving the remaining hierarchical level or hierarchical levels.

The one or more computing systems 100E may also execute a model extraction module (122E) that perform one or more algorithms (e.g., an algorithm based on random walk theory) on the electronic design (e.g., one or more layouts corresponding to the schematic design based on which an extracted view is to be generated) to extract or otherwise determine pertinent information such as one or more parameters, one or more parameter values, connectivity (e.g., various connections in the electronic design, how various electronic design components are connected in the electronic design, etc.), geometric characteristics of circuit components, parasitics, etc. to determine an extracted model for a set of schematic circuit components.

A model extraction module (122E) may determine an extracted model at least by processing a corresponding layout or a portion thereof with the aforementioned one or more algorithms to extract or determine such pertinent information and further by evaluating such pertinent information with one or more relations (e.g., by fitting the pertinent information to a governing equation or relation). In addition or in the alternative, a model extraction module (122E) may also determine an extracted model based at least in part on bench measurement data as well as evaluation of the bench measurement data against one or more relations.

The computing system may also include one or more modules in the set of modules 152E. One or more modules in the set 152E may include or at least function in conjunction with a microprocessor 192E via a system bus 194E to access or invoke various modules in 152E (e.g., 110E, 122E, 124E, 114E, 112E, 120E, and 122E described above) in some embodiments. In these embodiments, a single microprocessor 192E may be included in and thus shared among more than one module even when the computing system 100E includes only one microprocessor 192E. A microprocessor 192E may further access some non-transitory memory 198E (e.g., random access memory or RAM) via a system bus 194E to read and/or write data during the microprocessor's execution of processes.

The one or more computing systems 100E may also execute a parsing module (122E) in the set of modules 152E to parse an extracted model for information pertaining to the extracted model. Such information may include, for example, one or more model parameters and/or one or more corresponding values thereof, identification of one or more ports, terminals, or pins for interconnecting the extracted model, connectivity information, electrical and/or physical characteristics pertaining to the set of circuit components represented by the extracted model, any combinations thereof, or any other suitable information, etc.

The one or more computing systems 100E may also execute a level detection module (114E) to process an electronic design of interest based in part or in whole upon an extracted model and/or information about the hierarchical structure of the electronic design to determine one or more hierarchical levels that pertain to the extracted model. These one or more hierarchical levels may be subject to selective flattening by an extracted view generation module (110E) for the creation of an extracted view.

As described herein, some embodiments identify and flatten one or more hierarchical levels in a schematic design by bringing the schematic instances at these one or more hierarchical levels to the one or more corresponding highest levels of these one or more hierarchical levels or to the one or more next higher hierarchical levels, whereas the remaining hierarchical level or hierarchical levels will be preserved without flattening in the extracted view generated by the extracted view generation module (110E). In some embodiments where an existing simulation model exists to represent a set of schematic circuit designs (e.g., a schematic hierarchical block, a schematic instance of an instance, etc.) at one of these remaining hierarchical levels that are not flattened to a simulation module (e.g., 112E), the one or more computing systems 100E may also execute a binding module (124E) to bind the existing simulation model with the set of schematic circuit components at the non-flattened hierarchical level in the extracted view.

The extracted view generated by the extracted view generation module (110E) may thus be modified with an extracted model determined by the model extraction module (120E) and optionally with a simulation model bound to the extracted view by a binding module (124E); and this extracted view may be provided to a simulation module (122E) that performs one or more analyses on the extracted view to characterize the electrical and/or thermal behaviors of the underlying electronic design in some embodiments.

In some embodiments, the one or more computing systems 100E may invoke various system resources such as the processor(s) or processor core(s), memory, disks, etc. The one or more computing systems 100E may also initiate or interact with other computing systems to access, via a computer bus architecture (e.g., a system bus, a control bus, a data bus, or any combinations thereof), various resources 128E that may comprise a floor planner, a global routing engine, and/or a detail routing engine 164E, a layout editor 166E, a design rule checker 168E, a verification engine 170E, etc.

These various resources 128E may further include, for example, one or more other EDA (electronic design automation) modules such as a schematic tool, a placement tool, a routing tool, verification tools, post-route or post-layout optimization tools, various photolithography tools (e.g., optical proximity correction or OPC tools, phase shift mask or PSM tools, resolution enhancement technology or RET tools, etc.), etc. to prepare the electronic design.

For example, these various resources 128E may further optionally include one or more signoff modules (not shown) to perform various signoff and design closure tasks to ensure that the electronic design implemented by various techniques described herein may be successfully fabricated while maintaining various performance, cost, reliability, and manufacturability requirements.

For example, the one or more signoff modules may include one or more timing signoff modules to perform timing analyses and timing closure related tasks (e.g., silicon-accurate timing signoff, signal integrity analyses, etc.) to ensure an electronic design meets power, performance, or other requirements before tapeout, one or more signoff parasitic extraction modules to provide silicon-accurate interconnect parasitic extraction and ensure first-pass silicon success, and one or more power signoff modules to perform various power integrity analyses, transistor-level electro-migration and IR-drop analyses, or other power and signal integrity analyses with SPICE-level accuracy or better accuracy with SPICE or SPICE-like simulations (e.g., Fast-SPICE, HSPICE, PSPICE, or any other SPICE-based or SPICE-compatible simulations) to ensure an electronic design meets or exceeds power, performance, and/or area goals in some embodiments.

The one or more signoff modules may include one or more physical verification modules (not shown) to perform various design rule checking, layout vs. schematic (LVS), etc. tasks to ensure that an electronic design meets or exceeds various spatial and other physical rules and one or more design for manufacturing (DFM) modules to address physical signoff and electrical variability optimization, correct lithography hotspots, predict silicon contours, improve yield, detect and repair timing and leakage hotspots to achieve variation- and manufacturing-aware signoff and design closure in some of these embodiments.

In addition or in the alternative, the one or more signoff modules may include one or more one or more computational lithography modules (not shown) to provide more accurate post-etch critical dimension accuracy and process windows on silicon, reticle and wafer synthesis, etc. to eliminate errors and/or reduce mask-manufacturing cycle times. One or more of these signoff modules may operate on the electronic design produced or modified with various techniques to be described in the following sections for proper signoff and design closure so that the signoff version of the electronic design may be properly manufactured with first-pass or fewer passes silicon success in some embodiments. In these embodiments, the signoff version of the electronic design produced or modified with various techniques described herein causes the underlying electronic circuit to be manufactured by a foundry or IC (integrated circuit) fabrication facility when the signoff version of the electronic design is forwarded to the foundry or IC fabrication facility that in turn fabricates the requisite photomasks and the eventual electronic circuit.

Once sign-off and/or design closure is achieved, the electronic design is finalized for tapeout; and the electronic design is transmitted to mask fabrication equipment for mask preparation and mask writing to produce photomasks that are then used in the actual manufacturing of the electronic circuits represented by the electronic design.

The one or more computing systems 100E may further write to and read from a local or remote (e.g., networked storage device(s)) non-transitory computer accessible storage 162E that stores thereupon data or information such as, but not limited to, one or more databases (174E) such as schematic design database(s) or physical design database(s), electronic circuit design specification database(s), techfiles for multiple design fabrics, various statistics, various data, rule decks, various design rules, constraints, etc. (172E), or other information or data (176E) that may be used to facilitate the performance of various functions described herein. The one or more databases (174E) may also include, for example, one or more data structures for facilitating clustering, flattening, simplification, etc. in electronic designs.

In some embodiments, the computing system 100E may include the various resources 128E such that these various resources may be invoked from within the computing system via a network or a computer bus 190E (e.g., an internet session, an intranet session, a data bus interfacing a microprocessor 192E and the non-transitory computer accessible storage medium 198E (e.g., memory) or a system bus 194E between a microprocessor 192E and one or more engines or modules in the various resources 128E). In some other embodiments, some or all of these various resources may be located remotely from the computing system 100E such that the computing system may access the some or all of these resources via a computer bus 190E and one or more network components.

In some embodiments, the computing system 100E may include the various resources 128E such that these various resources may be invoked from within the computing system via a system bus 194E (e.g., a data bus interfacing a microprocessor 192E and the non-transitory computer accessible storage medium 198E or a computer bus 190E between a microprocessor 192E and one or more engines in the various resources 128E). In some other embodiments, some or all of these various resources may be located remotely from the computing system 100E such that a computing system 100E may access the some or all of these resources via a computer bus 100E and one or more network components.

Each of various modules and engines described herein may be implemented as a pure hardware implementation (e.g., in the form of firmware, application specific IC, etc.), a pure software implementation, or a combination of hardware and software implementation. In some embodiments where a module is implemented at least partially as a software implementation, the module may be stored at least partially in memory (e.g., in random access memory, instruction cache, etc.) of at least one of these one or more computing systems 100E for execution.

Figure 2A:
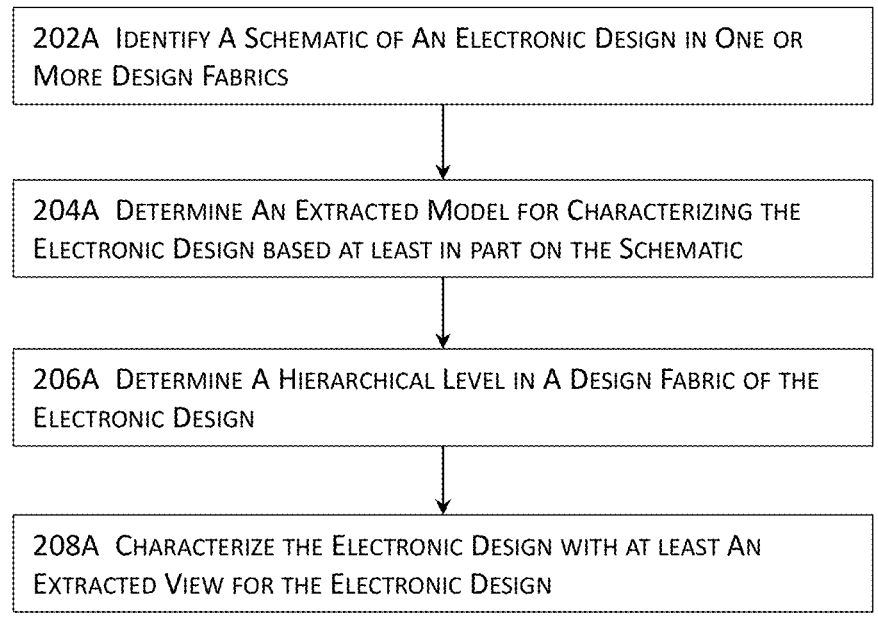
FIG. 2A illustrates a high-level block diagram for characterizing an electronic design with a schematic driven extracted view in one or more embodiments.

FIG. 2A illustrates a high-level block diagram for characterizing an electronic design with a schematic driven extracted view in one or more embodiments. In these one or more embodiments, a schematic of an electronic design may be identified at 202A. The electronic design and hence the schematic may entirely exist in one design fabric (e.g., a system design fabric, a PCB design fabric, an IC package design fabric, an IC design fabric, etc.) in some embodiments or may span across multiple design fabrics in some other embodiments.

An extracted model may be determined at 204A. An extracted model may include, for example, a SPICE model, an IBIS model, an S-parameter model, a Y-parameter model, a Z-parameter model, an H-parameter model, a T-parameter model, an ABCD-parameter model, etc. An extracted model describes the electrical and/or thermal behavior of a set of circuit components and may be referenced and understood by a simulation module that performs one or more analyses on an extracted view having the extracted model to characterize the underlying electronic design. For example, an S-parameter model describes the electrical behavior of a passive circuit component (e.g., an interconnect); and an IBIS model describes the electrical behavior of an active circuit component (e.g., a transistor). An extracted model may be determined at 204A anew or may be identified from a repository storing a plurality of extracted models.

An extracted model may be determined anew at 204A by, for example, applying one or more stimuli to the electronic design (e.g., a layout corresponding to the electronic design) and by performing one or more algorithms (e.g., an algorithm based on random walk theory) on the electronic design (e.g., one or more layouts corresponding to the schematic design based on which an extracted view is to be generated) to extract or otherwise determine pertinent information for constructing the extracted model from the results of the performance of these one or more algorithms.

Such pertinent information may include, for example, one or more parameters, one or more parameter values, connectivity (e.g., various connections in the electronic design, how various electronic design components are connected in the electronic design, etc.), geometric characteristics of circuit components, parasitics, etc. to determine an extracted model for a set of schematic circuit components. In an example where an S-parameter model is to be extracted or determined, the aforementioned one or more parameters may include reflection or return loss, transmission loss, insertion loss, near-end crosstalk, far-end cross-talk, etc.

With the pertinent information obtained, an extracted model may be extracted or determined at 204A by, for example, evaluating such pertinent information against one or more pre-established relations (e.g., by fitting the pertinent information to a governing equation or relation). In addition or in the alternative, an extracted model may also be determined or extracted based at least in part on bench measurement data as well as evaluation of the bench measurement data against one or more relations.

With the extracted model determined at 204A, one or more hierarchical levels pertaining to the extracted model in of the electronic design may be determined at 206A. Each of these one or more hierarchical levels determined at 206A may be completely flattened in some embodiments or partially flattened in some other embodiments. In some embodiments where a hierarchical level identified at 206A is partially flattened, these embodiments flatten only one or more instances at the hierarchical level while the remaining instances are not flattened, and the original schematic instances are thus preserved in the extracted view.

The remaining hierarchical levels in the electronic design will be preserved and not flattened for the creation of an extracted view by the process illustrated in FIG. 2A in some embodiments. In these embodiments, each original schematic design corresponding to a remaining hierarchical level will be preserved and propagated into the extracted view, without flattening.

Once the one or more hierarchical levels have been identified at 206A, an extracted view may be generated at least by, for example, flattening the one or more schematic designs corresponding to the one or more hierarchical levels into the extracted view and further by binding the extracted model determined at 204A with the corresponding schematic circuit component(s) in the extracted view. Binding an extracted model with the corresponding schematic circuit component(s) may be achieved by, for example, linking or associating the extracted model with corresponding schematic circuit component(s), inserting and interconnecting the extracted model in the extracted view, or replacing the corresponding schematic circuit component(s) with the extracted model.

In some embodiments where a preexisting simulation model has already existed to represent a set of schematic circuit components at a non-flattened hierarchical level, the extracted view may be further modified with the preexisting simulation model. Similar to binding an extracted model to a set of schematic circuit components, a preexisting simulation model may also be bound to the extracted view by, for example, linking or associating the preexisting simulation model with corresponding schematic circuit component(s), inserting and interconnecting the preexisting simulation model in the extracted view, or replacing the corresponding schematic circuit component(s) with the preexisting simulation model. With the extracted view generated, the electronic design may then be characterized at 208A by using the extracted view.

Figure 2B:
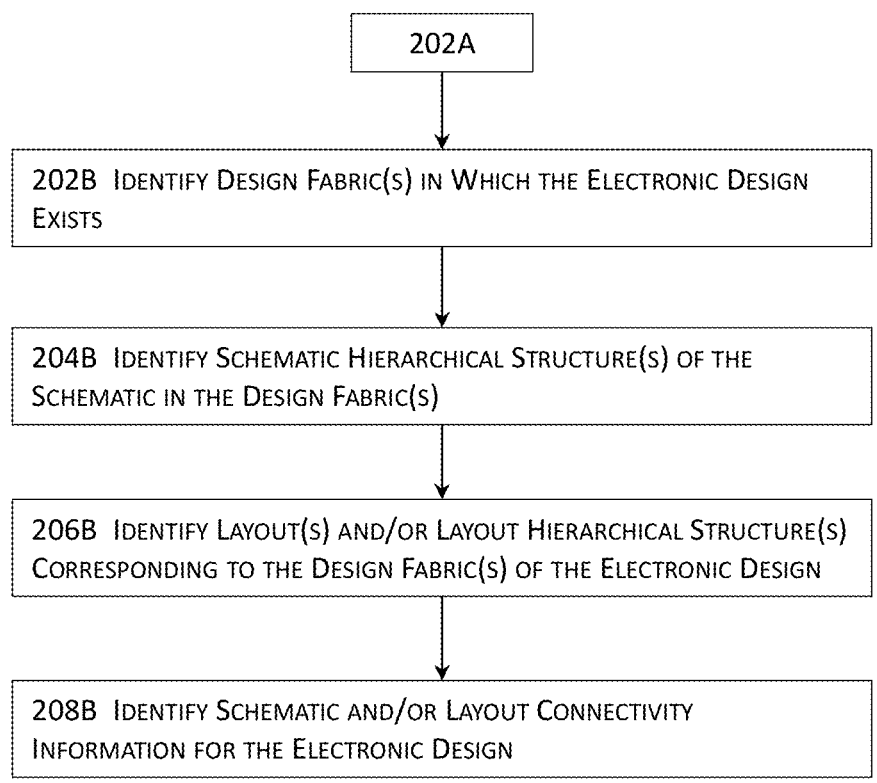
FIG. 2B illustrates more details about a portion of the high-level block diagram illustrated in FIG. 2A in one or more embodiments.

FIG. 2B illustrates more details about a portion of the high-level block diagram illustrated in FIG. 2A in one or more embodiments. More specifically, FIG. 2B illustrates more details about identifying a schematic of an electronic design. In these embodiments illustrated in FIG. 2B, one or more design fabrics across which the electronic design spans may be identified at 202B. These one or more design fabrics include, for example, an IC design fabric, an IC package design fabric, a PCB design fabric, and/or a system design fabric, etc. The schematic hierarchical structure of the schematic design in each of the one or more design fabrics may be identified at 204B. In an example where an electronic design spans across an IC design fabric, an IC package design fabric, and a PCB design fabric, the respective hierarchical structure for each of the IC schematic, IC package schematic, and PCB schematic may be identified at 204B.

With the design fabric(s) and schematic hierarchical structure respectively identified at 202B and 204B, a layout in at least one design fabric of the one or more design fabrics across which the electronic design spans may be identified at 206B. The layout identified at 206B may be used for extracting one or more extracted models (e.g., a SPICE model, an S-parameter model, etc.) that may be further incorporated into a schematic-driven extracted view for the electronic design. In some of these embodiments, other information such as the layout hierarchical structure of the identified layout may also be identified at 2066.

In addition or in the alternative, the schematic connectivity and/or the layout connectivity may be identified at 208B for the electronic design. The connectivity information may be referenced when inserting, placing, and/or interconnecting an extracted model or a simulation model into an extracted view. The connectivity information may include, for example, various connections in the corresponding design (e.g., schematic or layout), how various circuit components are connected in the corresponding design, an identification of a port, a terminal, or a pin, etc. that is used to interconnect a circuit component to another circuit component, or information about one or more nets connected to a circuit component, or any combinations thereof, or any other suitable types of information, etc.

Figure 2C:
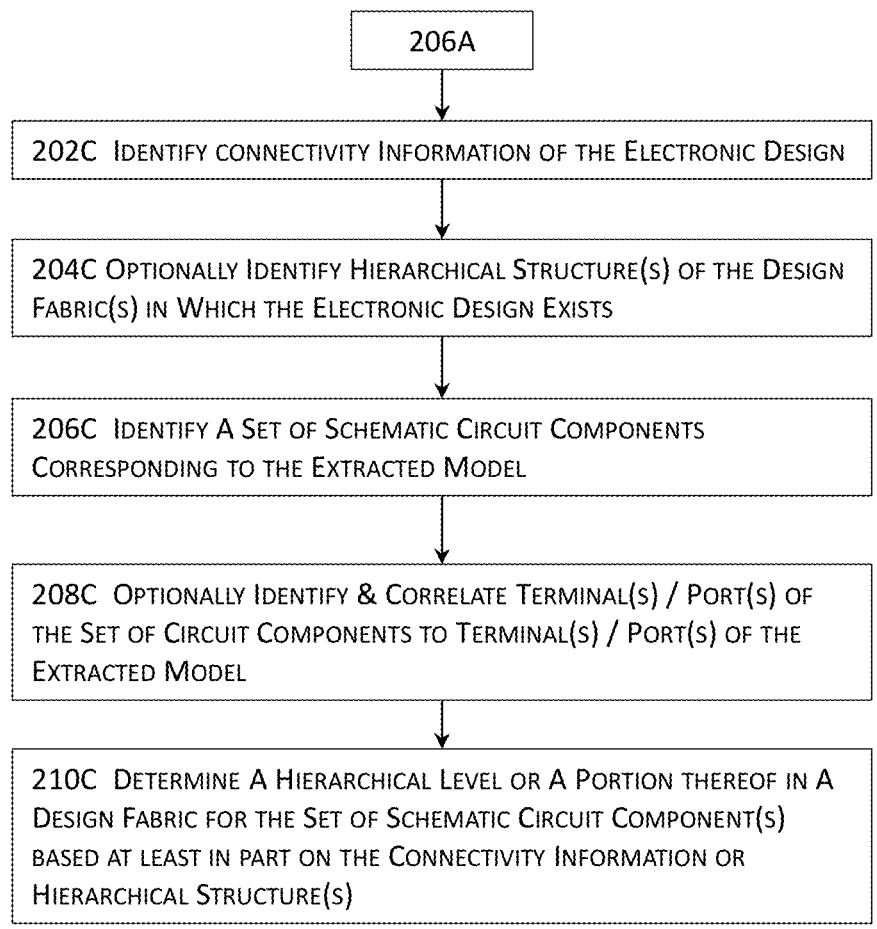
FIG. 2C illustrates more details about a portion of the high-level block diagram illustrated in FIG. 2A in one or more embodiments.

FIG. 2C illustrates more details about a portion of the high-level block diagram illustrated in FIG. 2A in one or more embodiments. More specifically, FIG. 2C illustrates more details about determining a hierarchical level at 206A of FIG. 2A. In these embodiments illustrated in FIG. 2C, information about connectivity and/or the hierarchical structure of a design fabric may be identified at 202C. Such information may include, for example, port identifications that identify one or more terminals, ports, pins, etc. of a set of one or more circuit components. This information may be subsequently used in, for example, inserting, placing, and/or interconnecting an extracted model or a simulation model.

For example, when inserting and interconnecting an extracted model or a simulation model to a net in an extracted view, the corresponding terminal, pin, or port of the extracted model or simulation model may be identified with the information identified at 202C. It shall be noted that although the corresponding terminal, pin, or port of a model may be identified in this manner, it does not necessarily require that the identification of the terminal, port, or pin in the model is exactly identical to that in the information identified at 202C. In some embodiments, these two pieces of information may be identical, whereas these two pieces of information may be different in some other embodiments. In these other embodiments where these two pieces of information differ, a corresponding mapping between the identification of the terminal, port, or pin of an extracted or simulation model and the corresponding connectivity information may be established (e.g., established by the net(s) or net segment(s) that is (are) used to interconnect the corresponding set of circuit components in the schematic or layout); and this mapping may also be identified at 202C in these embodiments.

Information of a hierarchical structure of the corresponding electronic design in a design fabric may be optionally identified at 204C. Such information may include, for example, the hierarchical levels in the hierarchical structure, the relationships (e.g., parent-child relationships) between the hierarchical levels, and/or the respective identifications of the hierarchical levels in the corresponding electronic design in the design fabric. Moreover, such information may be identified from, for example, the schematic database(s), the layout database(s), or any other suitable sources. In addition, such information may be subsequently used in determining one or more hierarchical levels pertaining to an extracted model.

A set of circuit components that corresponds to the extracted model may be identified at 206C. This set of circuit components will be represented by the extracted model in the extracted view provided to a simulation or analysis module. In some embodiments where the extracted model is extracted from a layout of the electronic design, this set of circuit components may be identified from the schematic design that corresponds to the layout. In some other embodiments where the extracted model is identified from a repository having a plurality of extracted models, this set of circuit components may be identified at 206C based on information such as connectivity, device type (e.g., the type of the device represented by the extracted model), device identification (e.g., the name of the device represented by the extracted model), information about one or more other circuit components connected to the extracted model, one or more operation characteristics, or any combinations thereof, or any other suitable information.

A terminal, port, or pin in the set of circuit components identified at 206C may be optionally correlated to a terminal, port, or pin of the extracted model at 208C. This correlation may be subsequently used in inserting, placing, and/or interconnecting the extracted model in the extracted view although this correlation is not absolutely necessarily. For example, an extracted model may also be inserted, placed, and/or interconnected in an extracted view by using connectivity information.

A hierarchical level or a portion thereof in the schematic of the electronic design in a design fabric may be determined at 210C for the set of circuit components based at least in part upon the connectivity information identified at 202C or the information about the hierarchical structure optionally identified at 204C. This identified hierarchical level or the portion will be subject to the selective flattening descried herein for the generation of an extracted view.

Figure 2D:
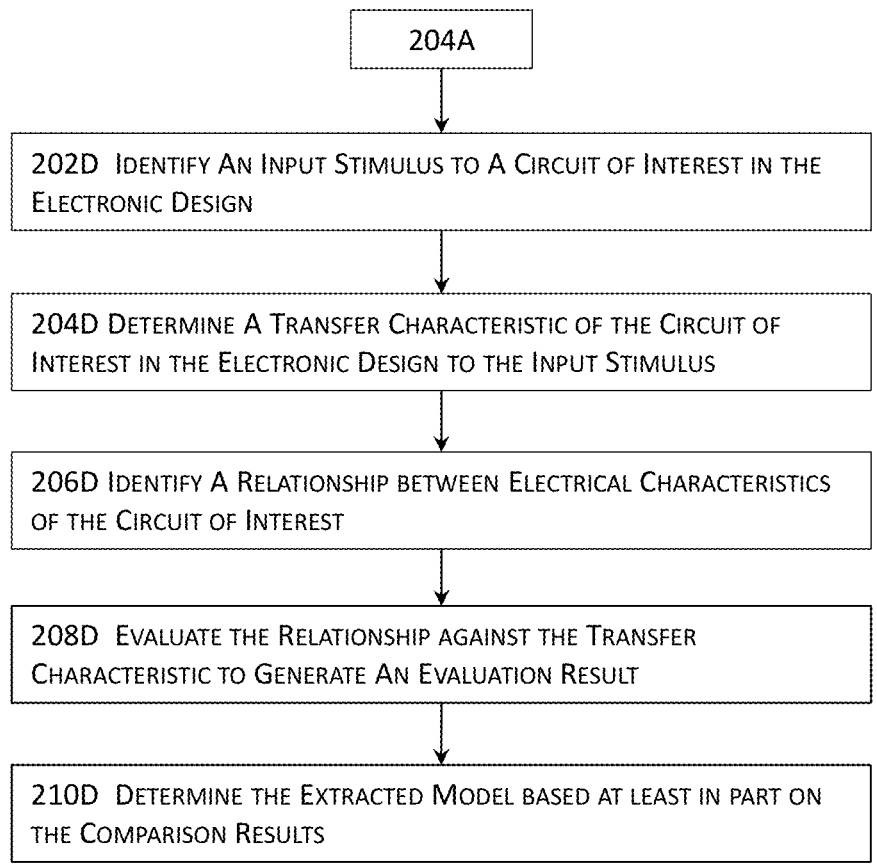
FIG. 2D illustrates more details about the block diagram illustrated in FIG. 2A in one or more embodiments.

FIG. 2D illustrates more details about the block diagram illustrated in FIG. 2A in one or more embodiments. More specifically, FIG. 2D illustrates more details about determining an extracted model at 204A of FIG. 2A. It shall be noted that an extracted model may be determined by many different methods, and that these embodiments illustrated in FIG. 2D provide one method for determining an extracted model although other methods may also be used and are thus also contemplated as within the scope of various embodiments described herein.

An input stimulus (e.g., an input signal, a bias condition, drain saturation condition, etc.) to a circuit of interest in the electronic design may be identified at 202D. A transfer characteristic (e.g., electric current, drain current, nodal voltage, etc.) may be determined at 204D for the circuit of interest based at least in part upon the input stimulus. For example, an input stimulus may be applied to a circuit of interest, and some embodiments simulate the response of the circuit of interest to the input stimulus and identify the response as the transfer characteristic at 204D. In some embodiments, a transfer characteristic may be determined from measured bench data.

A relationship between multiple electrical characteristics of the circuit of interest may be identified at 206D. For example, a relationship between terminal voltage and drain currents of a transistor may be identified at 206D. This relationship may be physics-based, empirically determined, or model-based and may be further referenced at 208D where some embodiments fit the transfer characteristic determined at 204D to the relationship. For example, some embodiments may fit a square law formula for the relationship between terminal voltages and drain currents to the transfer characteristic (e.g., drain current determined under a number of conditions such as drain saturation conditions) of the circuit of interest at 208D. The extracted model may then be determined at 210D based in part or in whole upon the results of fitting the transfer characteristic to the relationship at 208D.

Figure 2E:
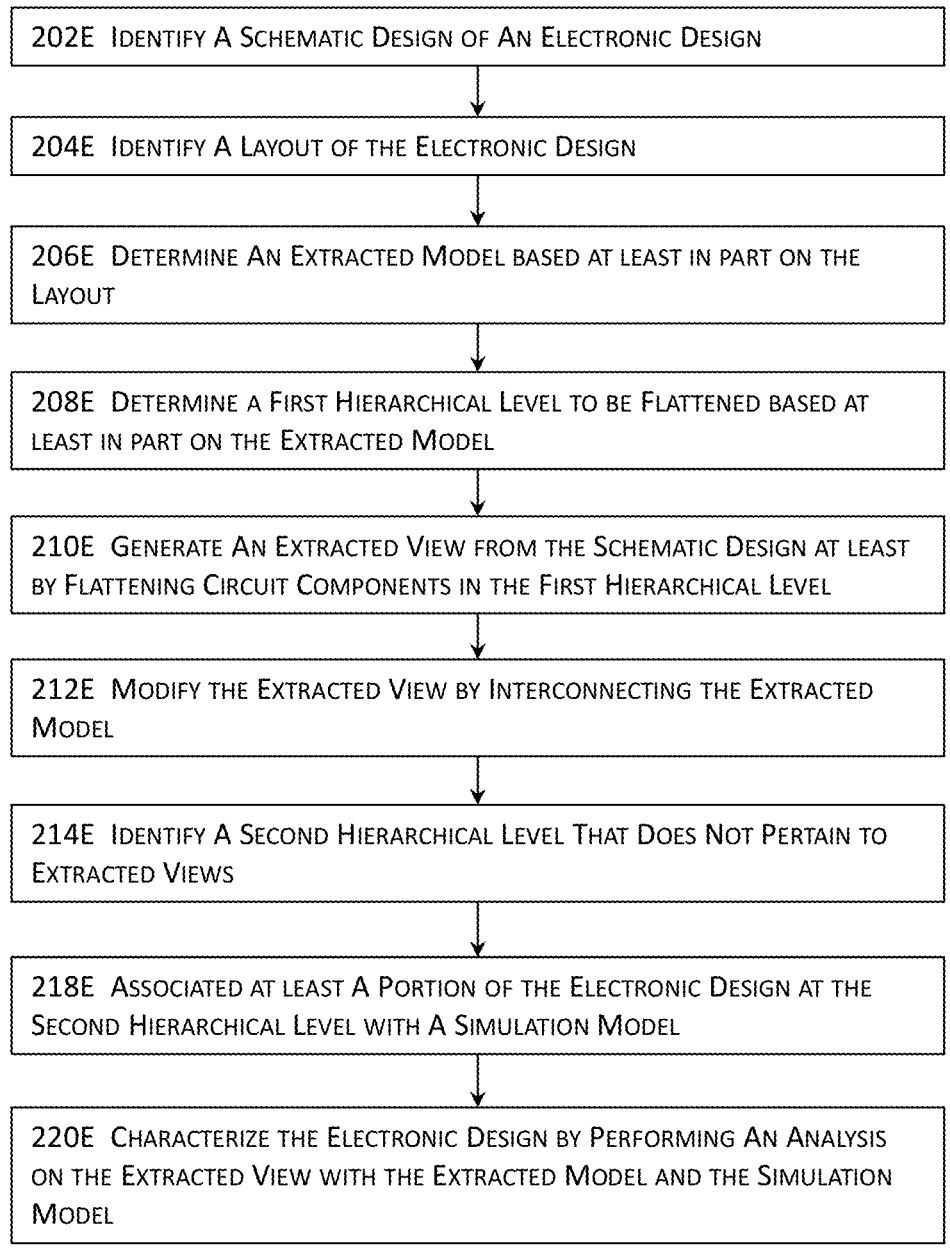
FIG. 2E illustrates a more detailed block diagram for characterizing an electronic design with a schematic driven extracted view in one or more embodiments.

FIG. 2E illustrates a more detailed block diagram for characterizing an electronic design with a schematic driven extracted view in one or more embodiments. In these embodiments illustrated in FIG. 2E, the electronic design exists in a single design fabric. At 202E, a schematic deign of an electronic design may be identified. For example, the electronic design may represent a server rack having multiple server boxes therein, a single server box having a printed circuit board for the server box, a printed circuit board having one or more IC packages, a single IC package having one or more ICs therein, or a single IC. The layout of the electronic design may be identified at 204E; and an extracted model that represents a set of circuit components may be determined or extracted at 206E from the layout.

An extracted model described herein may include, for example, one or more elements describing the properties of components (e.g., inductors, capacitors, resistors, etc.) as well as the transient or steady-state electrical behavior of a circuit component in response to one or more stimuli by one or more electrical signals. Examples of such one or more elements may include gains, return loss, voltage standing wave ration, reflection coefficient, amplifier stabilities, etc. The electrical behaviors described by an extracted model may include, for example, Examples of extracted models may include, for example, an s-parameter model, a Y-parameter model, a Z-parameter model, an H-parameter model, a T-parameter model, an ABCD-parameter model, an IBIS model, a SPICE model, etc.

For characterizing the electronic design with an extracted model and an extracted view, one or more hierarchical levels in the electronic design may be determined at 208E. Some embodiments use a hierarchy detector module or engine to determine the hierarchical level (or hierarchical levels) in the electronic design that needs to be flattened during the generation of an extracted view. In the simplified example illustrated in FIG. 2G including a schematic 290G and an extracted view 292G of a simplified example electronic design, schematic level 0 of the schematic design 290G includes a set of circuit components 202G to be represented as an s-parameter model 250G in the extracted view 292G; and schematic level 1 of the schematic design 290G includes another set of circuit components 206G to be represented as another s-parameter model 252G in the extracted view 292G.

In this example, a hierarchy detection module may determine that a portion of the schematic hierarchical level 0 corresponding to the s-parameter model 250G needs to be flattened, and that a portion of the schematic hierarchical level 1 corresponding to the s-parameter model 252G also needs to be flattened for creating the extracted view. An extracted view generation module may thus generate a single extracted view 292G for the electronic design at 210E by selectively flattening these two determined portions (or these two hierarchies in their respective entireties) respectively located in the schematic hierarchical level 0 and schematic hierarchical level 1.

In some embodiments, the entire schematic hierarchical level 0 and schematic hierarchical level 1 may be flattened while preserving the remaining hierarchical level(s) not pertaining to any extracted models. That is, the extracted view generation module will not flatten schematic hierarchical level 2 of the schematic 290G because none of the circuit components at schematic hierarchical level 2 are to be represented by any extracted models. Therefore, schematic hierarchical level 2 may be preserved and remain unchanged from the original schematic representation; and the extracted view 292G may reference the original schematic representation for schematic hierarchical level 2.

Flattening these two portions in schematic hierarchical level 0 and schematic hierarchical level 1 bring the circuit components in these two portions to the extracted view 292G. In this example, each of schematic hierarchical level 0 and schematic hierarchical level 1 is partially and selectively flattened. This is in sharp contrast with conventional approaches that non-selectively flatten every hierarchy in its entirety in the entire electronic design.

Furthermore, the original electronic design may be associated with the information of the hierarchical structure as well as circuit component identifiers (e.g., respective names of the circuit components). With such information pertaining to the hierarchical structure and circuit component identifiers, some embodiments may identify the circuit components respectively corresponding to extracted models 254G (corresponding to 250G) and 256G (corresponding to 252G) in the extracted view portion 210G with such information. A first set of circuit components corresponding to the extracted model 250G may be identified, and the extracted model 250G may be inserted into the extracted view portion 210G by, for example, connecting the port(s), pin(s), or terminal(s) in the extracted model 250G to the corresponding connection(s) to form 254G and connecting the port(s), pin(s), or terminal(s) in the extracted model 252G to the corresponding connections to form 256G.

This extracted model 250G may be inserted into the extracted view portion 210G in place of the first set of circuit components 202G in the extracted view portion 210G in some embodiments or may be inserted in addition to the first set of circuit components in the extracted view 210G in some other embodiments. With this extracted model 254G now inserted into the extracted view portion 210G, the extracted view portion 210G may present a first graphical representation of the original schematic symbol (or symbols) for the first set of circuit components (202G) in some embodiments, a second graphical representation of the extracted model (254G) but not the original schematic symbol (or symbols) of the first set of circuit components (202G) in some other embodiments, a third graphical representation showing the original schematic symbol (or symbols) with annotations from the extracted model (254G), or a fourth graphical representation showing the extracted model (254G) with annotations from the original schematic symbol (or symbols) of the first set of circuit components (202G).

Similarly, the extracted model 256G may be inserted to replace the second set of circuit components (206G) in the extracted view portion 210G in some embodiments or may be inserted in addition to the second set of circuit components (206G) in the extracted view portion 210G in some other embodiments.

With the modifications to the extracted view performed at 212E, a second hierarchical level that does not pertain to any extracted models (and hence not subject to flattening) may be identified at 214E; and a simulation model representing a group of circuit components for a simulator engine may be identified and bound or otherwise associated with the group of circuit components at 216E in some embodiments. The binding or association of a simulation model with a group of circuit components enables designs to reuse existing simulation models respectively built for specific simulators to be reused.

Nonetheless, such binding or association is at least practically impossible in conventional approaches because conventional extracted view generation approaches non-selectively flatten every hierarchy in a mono-fabric electronic design to create a highly cluttered extracted view or cell view so that any identification (manual, programmatic, or automated) of circuit components from such extracted views (at least one extracted view for each hierarchy in the electronic design) is practically impossible. Once the extracted model(s) and simulation model(s) are inserted and/or bound or associated with the extracted view, the electronic design may then be characterized at 220E by performing one or more electrical analyses on the extracted view that includes or is associated with the extracted model and simulation model.

Figure 2F:
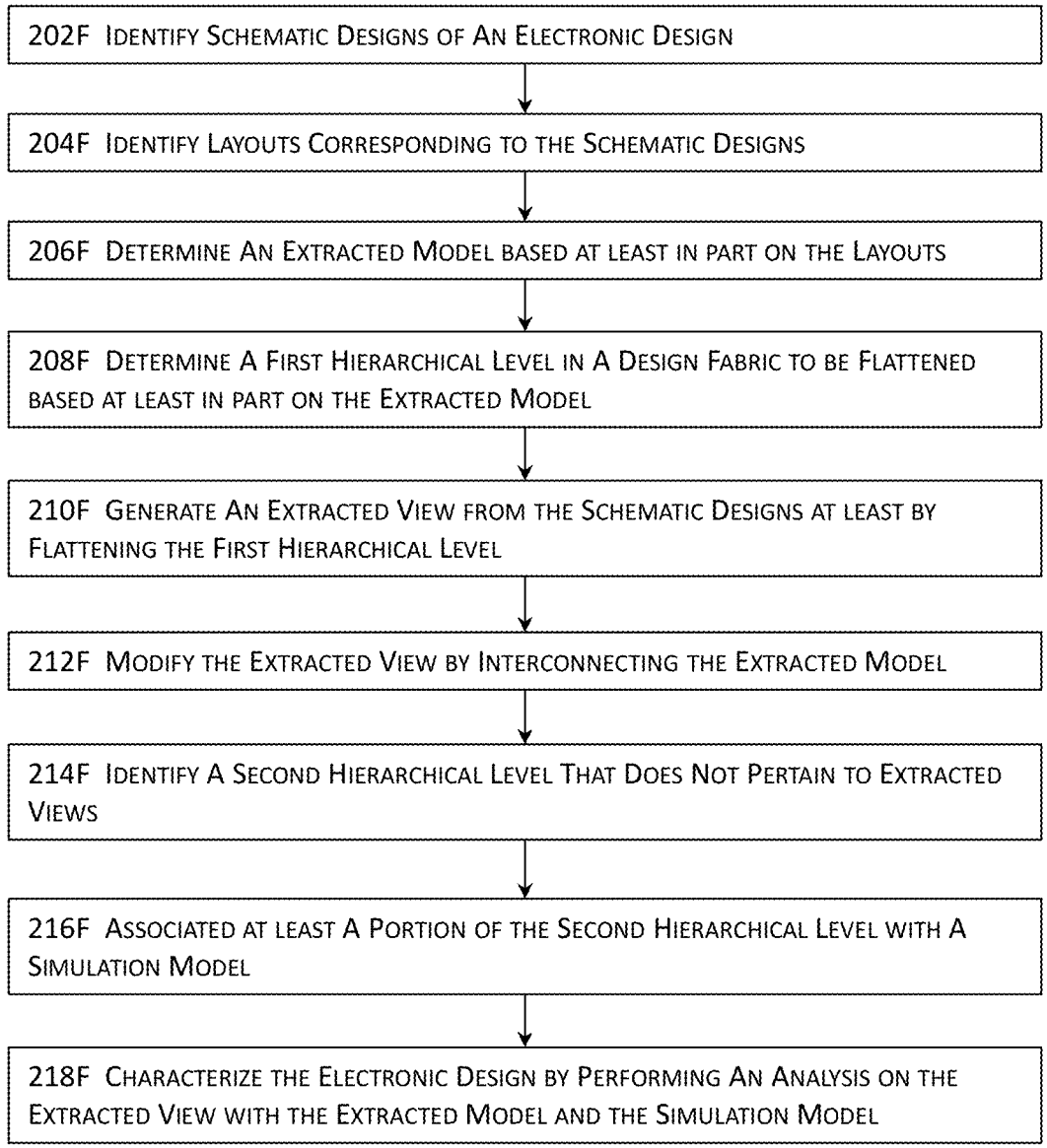
FIG. 2F illustrates a more detailed block diagram for characterizing an electronic design with a schematic driven extracted view in one or more embodiments.
Figure 2G:
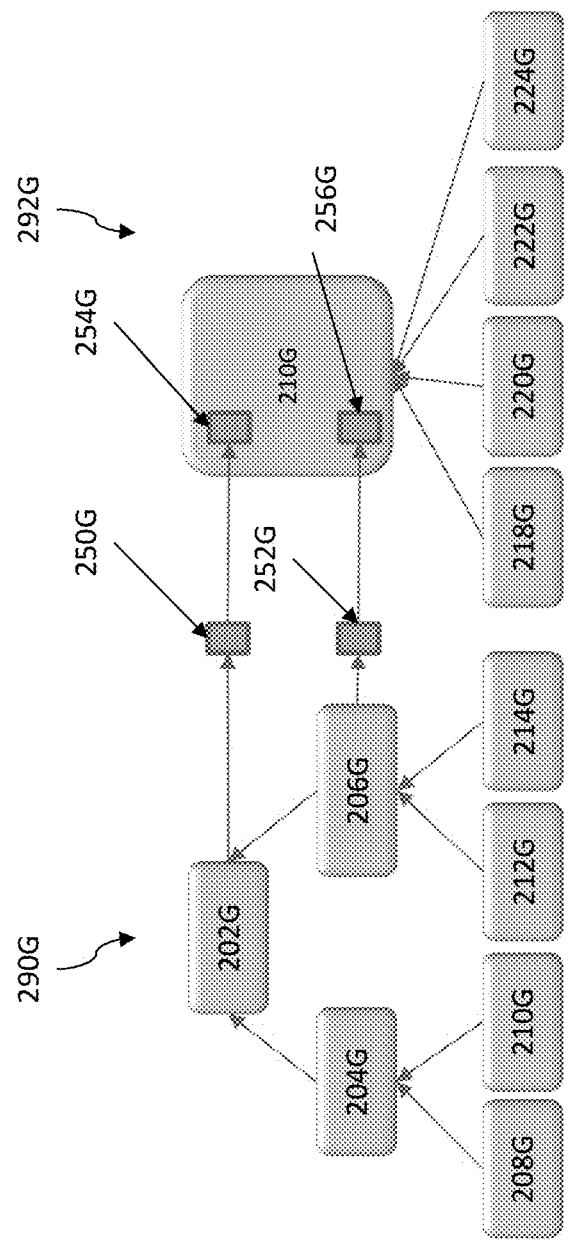
FIG. 2G illustrates an example including a simplified schematic design of an electronic design and a simplified representation of an extracted view corresponding to the simplified schematic design in one or more embodiments.

FIG. 2F illustrates a more detailed block diagram for characterizing an electronic design with a schematic driven extracted view in one or more embodiments. Unlike the mono-fabric electronic design illustrated in FIG. 2E, the electronic design spans across multiple design fabrics in these embodiments and may thus be termed as a cross-fabric or multi-fabric electronic design. At 202F, a schematic deign for each of the multiple design fabrics of an electronic design may be identified. The electronic design is a multi-fabric electronic design that spans across multiple design fabric. For example, the electronic design may represent two or more of (1) a server rack having multiple server boxes therein, (2) a single server box having a printed circuit board for the server box, (3) a printed circuit board having one or more IC packages, (4) a single IC package having one or more ICs therein, and (5) a single IC.

A layout for each of the multiple design fabrics of the electronic design may be identified at 204F; and an extracted model that represents a set of circuit components may be determined or extracted at 206F from these multiple layouts. An extracted model described herein may also include, for example, one or more elements describing the properties of components (e.g., inductors, capacitors, resistors, etc.) as well as the transient or steady-state electrical behavior of a circuit component in response to one or more stimuli by one or more electrical signals. Examples of such one or more elements may include gains, return loss, voltage standing wave ration, reflection coefficient, amplifier stabilities, etc. The electrical behaviors described by an extracted model may include, for example, Examples of extracted models may include, for example, an s-parameter model, a Y-parameter model, a Z-parameter model, an H-parameter model, a T-parameter model, an ABCD-parameter model, an IBIS model, a SPICE model, etc.

For characterizing the electronic design with an extracted model and an extracted view, one or more hierarchical levels in the multiple design fabrics in the electronic design may be determined at 208F. In this example, the electronic design is a cross-fabric electronic design. To further complicate the process that is far beyond the capability of any existing, conventional approaches, this example includes a model that also spans across multiple design fabrics (although not necessarily across all the design fabrics of the electronic design). For example, a net or a net segment may span across the PCB design fabric and an IC package design fabric.

Some embodiments use a hierarchy detection module or engine to determine, at 208F, the first hierarchical level (or hierarchical levels) at each of several design fabrics across which a set of circuit components to be represented by an extracted model spans. In some embodiments, each design fabric is processed separately and independently from each other to determine which portion and/or which hierarchical level(s) in a design fabric needs to be flattened and brought into the extracted view for further processing.

These embodiments first identify a design fabric from several design fabrics across which a set of circuit components spans. A first hierarchical level in the identified design fabric may be determined at 208F by referencing the hierarchical structure or the hierarchical design tree structure of electronic design in the design fabric and the set of circuit components to be represented as an extracted model. This hierarchical level may be determined by using, for example, schematic and/or layout connectivity information that comprises connection information for the set of circuit components. Some embodiments not only identify the first hierarchical level at 208F but also the instance(s) to which any circuit component of the set of circuit components belongs. This determination of hierarchical level (and optionally the aforementioned instance(s)) may be repeated for each design fabric of the several design fabrics across which the set of circuit components spans.

In some embodiments illustrated in FIG. 2F, the hierarchy detection module or engine may determine that only a smaller portion of a determined hierarchical level (e.g., the aforementioned instances in the description of 208F) needs to be flattened for a design fabric. An extracted view generator may thus generate a single extracted view for this design fabric of the electronic design at 210F by selectively flattening the determined portion. As described above, each design fabric of the several design fabrics may be processed separately and independently of each other. In some embodiments, these several design fabrics may be provided to a parallel or distributed computing environment that processes these several design fabrics in parallel.

In some embodiments, the entire hierarchical level determined at 208F may be flattened in the generation of the extracted view at 210F. Nonetheless, the extracted view generator will not flatten any hierarchical level whose circuit components will not be represented by different models, and thus the corresponding view portion requires no further modifications (e.g., insertion of an extracted model). These hierarchical levels may thus be preserved and remain unchanged from the original schematic representation. This approach illustrated in FIG. 2F is also in sharp contrast with conventional approaches that generates a view for each hierarchy by non-selectively flattening each hierarchy in each design fabric entirely and thus result in a large number of views that are not really correlated with each other (at least not correlated to a point where such a large number of views becomes useful for further processing).

Like the embodiments described with respect to FIG. 2E, the original electronic design may be associated with the information of the hierarchical structure as well as circuit component identifiers (e.g., in the connectivity information). With such information pertaining to the hierarchical structure and circuit component identification, some embodiments may identify the circuit components corresponding to an extracted model in the extracted view. Therefore, a set of circuit components corresponding to the extracted model may be identified, and the extracted model may be modified at 212F by inserting the extracted model into the extracted view and by, for example, connecting the port(s), pin(s), or terminal(s) in the extracted model to the corresponding connections.

This extracted model may be inserted to replace the set of circuit components in the extracted view in some embodiments or may be inserted in addition to the first set of circuit components in the extracted view in some other embodiments. With this extracted model inserted into the extracted view, the extracted view may present a first graphical representation of the original schematic symbol (or symbols) for the first set of circuit components in some embodiments, a second graphical representation of the extracted model but not the original schematic symbol (or symbols) of the first set of circuit components in some other embodiments, a third graphical representation showing the original schematic symbol (or symbols) with annotations from the extracted model, or a fourth graphical representation showing the extracted model with annotations from the original schematic symbol (or symbols) of the first set of circuit components.

With the modifications to the extracted view performed at 212F, a second hierarchical level not pertaining to extracted models may be identified at 214F; and an existing simulation model representing a group of circuit components at the second hierarchical level for a simulator engine may be identified and bound or associated with the group of circuit components at 216F in some embodiments. The binding or association of a simulation model with a group of circuit components (e.g., a hierarchical block such as a macro, an IP block, etc.) enables designers to reuse existing simulation models built for particular simulators to be reused.

Nonetheless, such binding or association is at least practically impossible for conventional approaches because conventional extracted view generation approaches non-selectively flatten every hierarchy in each design fabric of multiple design fabrics of a cross-fabric electronic design to create a highly cluttered extracted view or cell view so that any identification (manual, programmatic, or automated) of circuit components from such extracted views (at least one extracted view for each hierarchy of each design fabric of multiple design fabrics in the electronic design) is practically impossible. Once the extracted model(s) and simulation model(s) are inserted and/or associated with the extracted view, the electronic design may then be characterized at 218F by performing one or more electrical analyses on the extracted view that includes or is associated with the extracted model and simulation model.

Figure 3A:
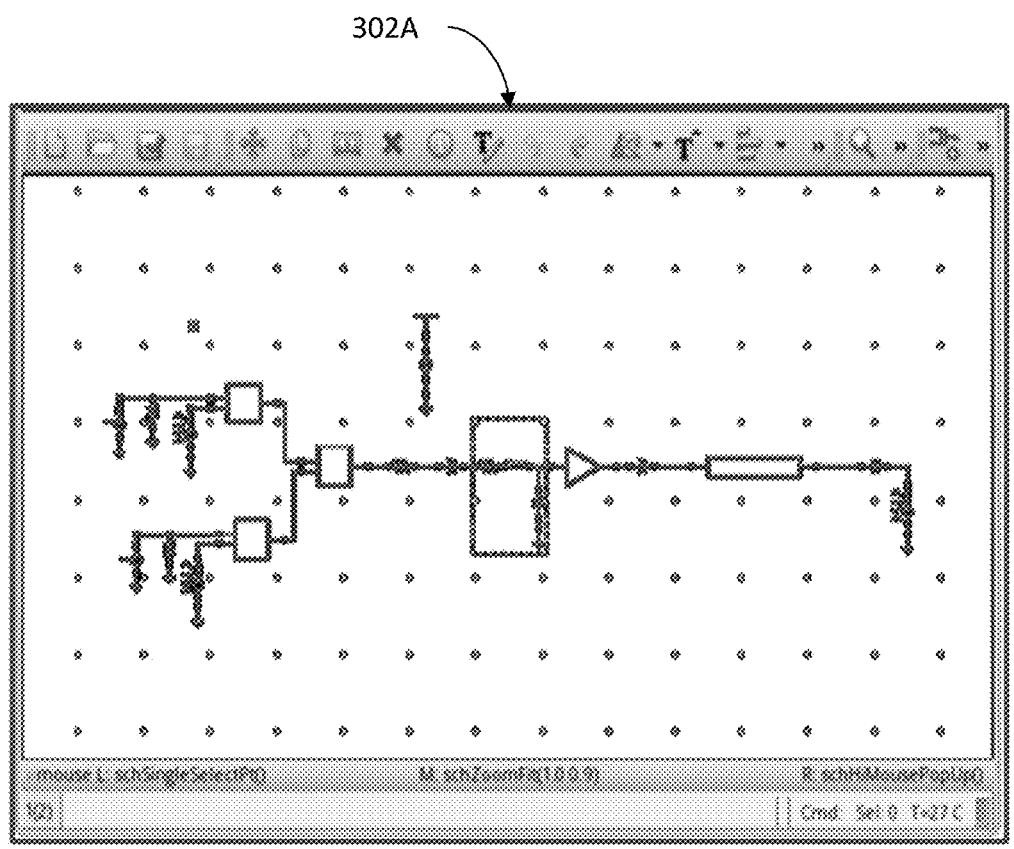
FIG. 3A illustrates an example schematic of a simplified electronic design in one or more embodiments.

FIG. 3A illustrates an example schematic of a simplified electronic design in one or more embodiments. Various techniques described herein may be applied to the example schematic 302A to generate a single extracted view that may be further provided to a simulation module to characterize the electrical and/or thermal behaviors of the example electronic design 302A.

Figure 3B:
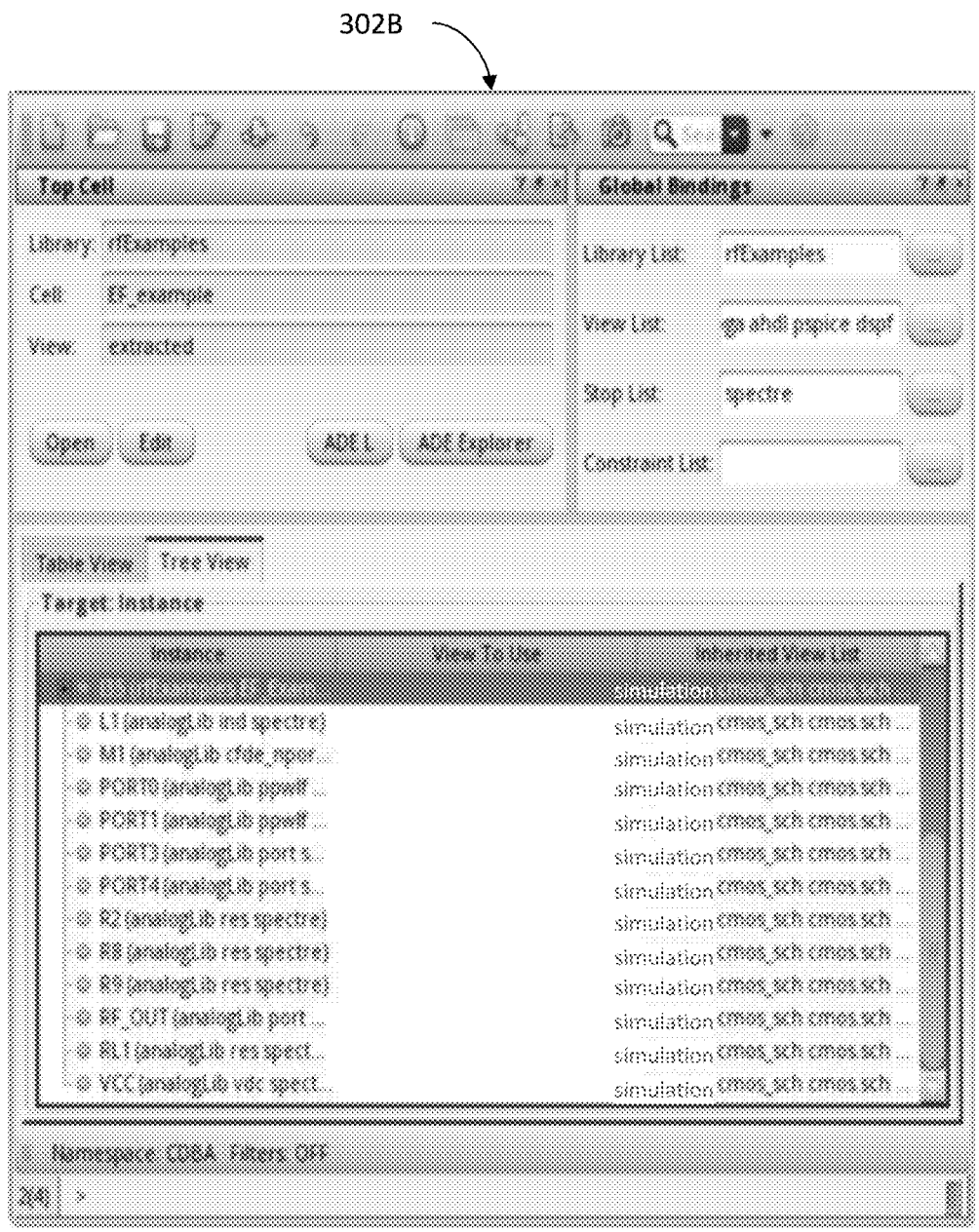
FIG. 3B illustrates an example approach that creates an extracted view by binding each hierarchical level created for each design fabric of the electronic illustrated in FIG. 3A into the extracted view.

FIG. 3B illustrates an example approach that creates an extracted view by binding a respective extracted view created for each hierarchical level in each design fabric of the electronic illustrated in FIG. 3A into the extracted view. More particularly, FIG. 3B illustrates a conventional approach that binds every hierarchical level in the example electronic design (302A) to the extracted view generation process and creates a separate extracted view for each hierarchical level in the electronic design.

FIG. 3C illustrates an example netlist for the extracted view with a model for the electronic illustrated in FIG. 3A. More particularly, FIG. 3C illustrates the resulting netlist 302C of the conventional approaches described with reference to FIG. 3B. The netlist 302C created by such conventional approaches include all the sub-circuits in the electronic design due to the non-selective flattening of each hierarchical level in the electronic design and is thus extremely long.

One of the advantages of various embodiments described herein over these conventional approaches is that the netlist generated with various embodiments described herein is significantly shorter than the netlist 302C because some embodiments described herein selectively flatten only the hierarchical level(s) pertaining to one or more extracted models in the creation of a single extracted view, and the resulting netlist thus does not include as many sub-circuits and other information as the netlist 302C created by conventional approaches. In addition to a significantly longer netlist, a disadvantage of such a netlist 302C is that it is much more difficult to insert an extracted model 304C into such a netlist simply due to the size and complexity of the significantly longer netlist 302C.

Figure 3D:
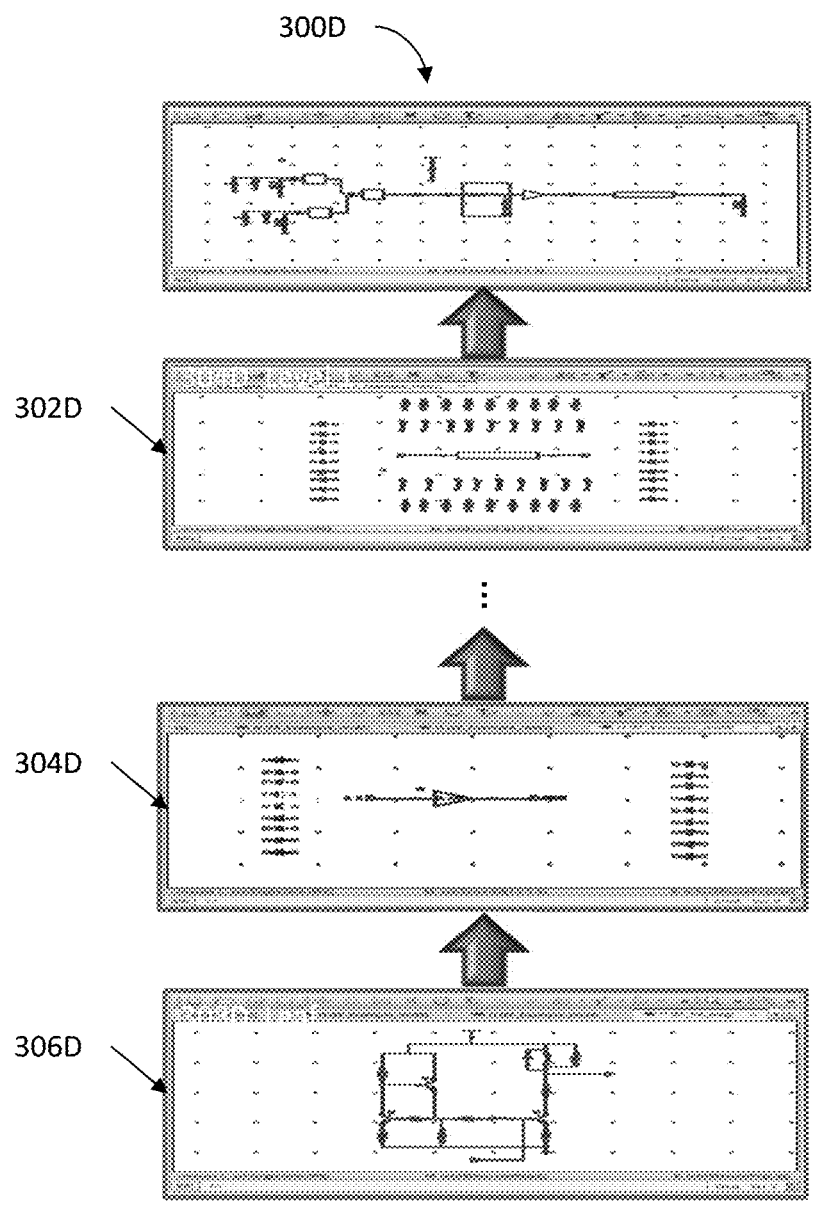
FIG. 3D illustrates an example approach that creates an extracted view by copying each hierarchical level in each design fabric of the electronic illustrated in FIG. 3A into the extracted view.

FIG. 3D illustrates an example approach that creates an extracted view by copying each hierarchical level in each design fabric of the electronic illustrated in FIG. 3A into the extracted view. More particularly, FIG. 3D illustrates that the example electronic design (302A) includes four hierarchical levels—level 0 (300D) as the highest hierarchical level in the electronic design (302A), level 1 (302D) that is a child hierarchy of level 0 (300D), level 2 (304D) that is a child hierarchy of level 1 (302D), and hierarchical level 3 (306D) that is a child hierarchy of level 2 (304D). As described above, conventional approaches generate an extracted view for each hierarchical level. For the example electronic design illustrated in FIGS. 3A and 3D, conventional approaches thus generate four separate extracted views—one of each of hierarchical levels 0, 1, 2, and 3.

Figure 3E:
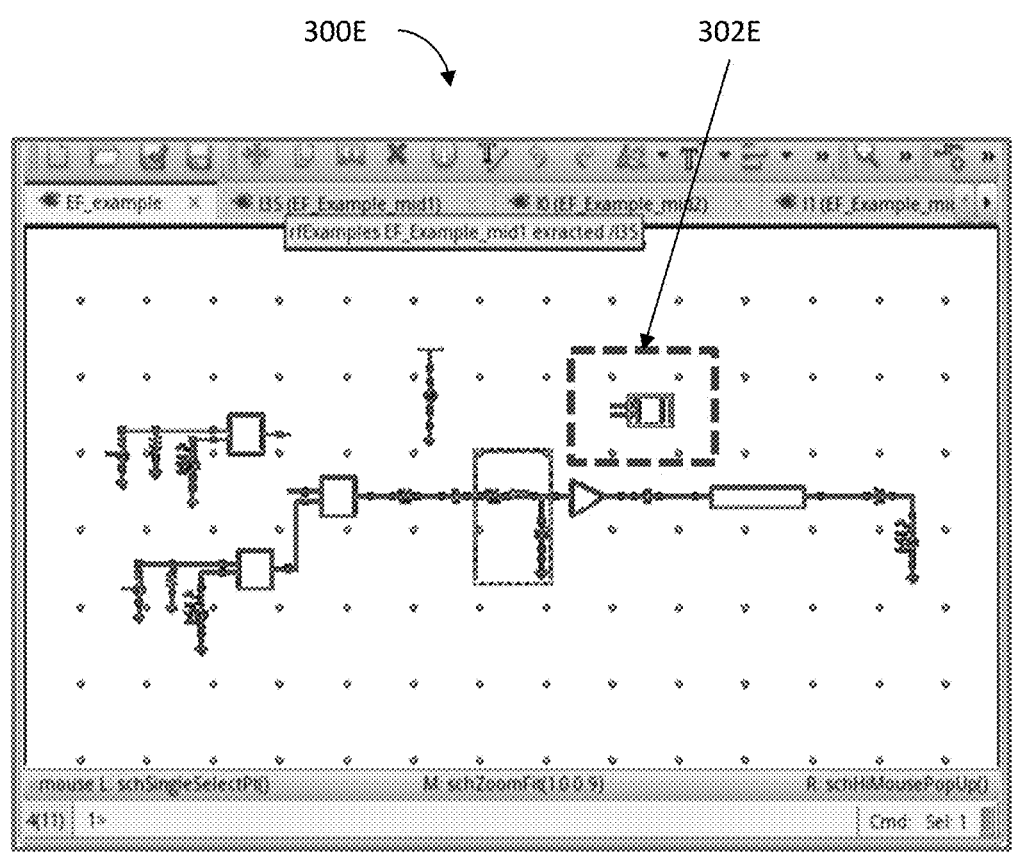
FIG. 3E illustrates an example of creating a single extracted view for the electronic design illustrated in FIG. 3A while hierarchical levels not pertaining to extracted models remain the same as the original schematic designs in one or more embodiments.

FIG. 3E illustrates an example of creating a single extracted view for the electronic design illustrated in FIG. 3A while hierarchical levels not pertaining to extracted models remain the same as the original schematic designs in one or more embodiments. More specifically, FIG. 3E illustrates the single extracted view 300E that is generated by some techniques described herein. In this example, an extracted model is to be incorporated into the extracted view to represent a set of circuit components (e.g., an instance) at the hierarchical level 0 (the highest hierarchical level in the example electronic design 302A).

This single extracted view 300E is generated by either selectively flattening either the entire hierarchical level 0 or only a smaller portion (e.g., the instance to be represented by the extracted model) of the hierarchical level 0. In addition, the remaining hierarchical levels 1, 2, and 3 do not pertain to the extracted model and will thus be preserved and not flattened. In creating the single extracted view 300E, some embodiments flatten hierarchical level 0 (or a portion thereof) and reference the original schematic designs for hierarchical levels 1, 2, and 3 without flattening these remaining hierarchical levels. The extracted model 302E is inserted into the extracted view 300E in an identical or substantially similar manner described above. Some embodiments may further modify the extracted view 300E by binding or associating a simulation model with a set of circuit components (e.g., a hierarchical block) at hierarchical level 1, 2, or 3.

Figure 3F:
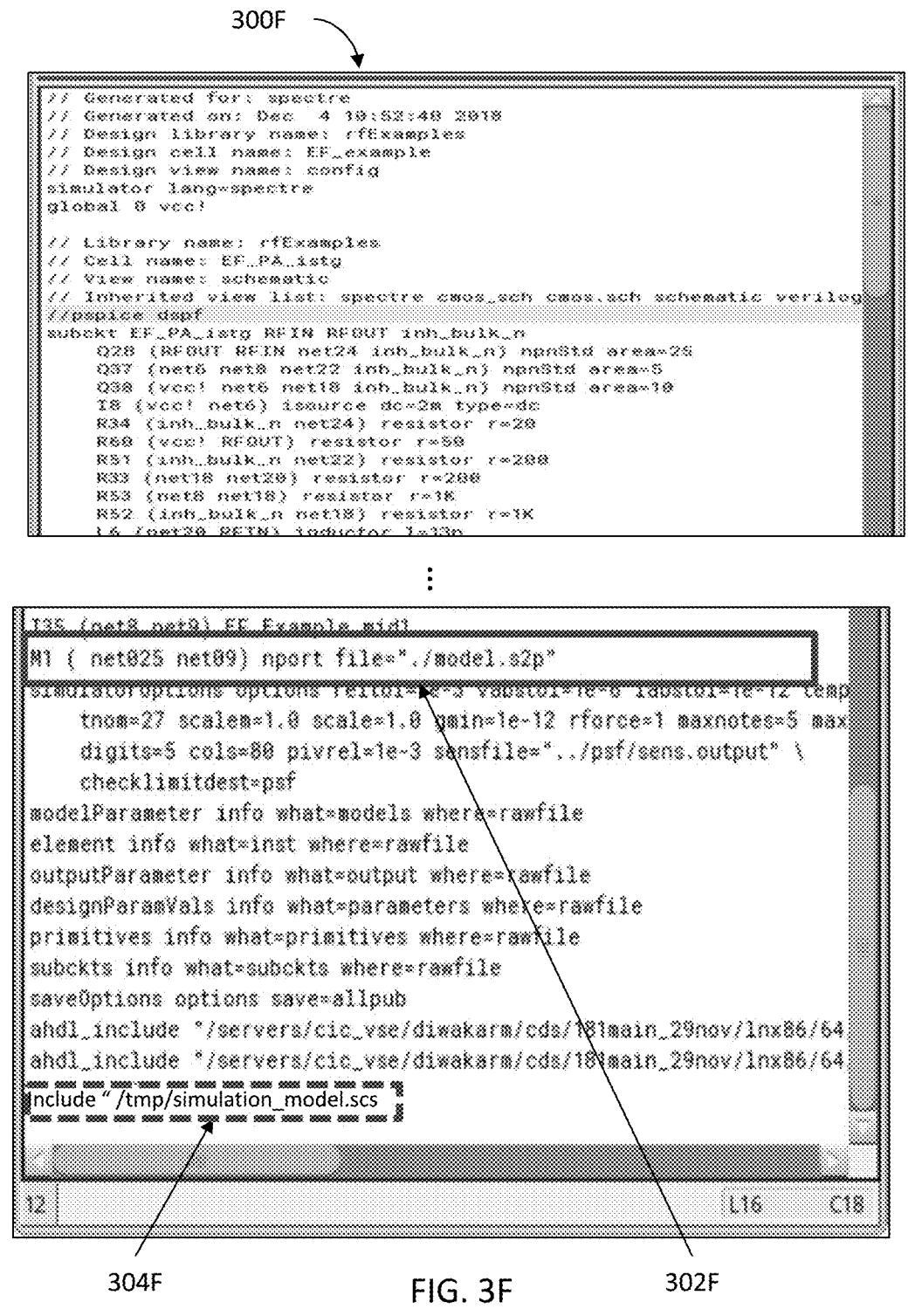

FIG. 3F illustrates an example netlist for the single extracted view modified with an extracted model and a simulation model for the electronic illustrated in FIG. 3A by using some of the techniques described herein in one or more embodiments. More specifically, FIG. 3F illustrates the resulting netlist created by some embodiments described above with reference to FIG. 3E. The resulting netlist 300F is much shorter and includes much fewer sub-circuits and information than the netlist 302C illustrated in FIG. 3C because these embodiments selectively flatten only hierarchical level 0 while preserving the original schematic designs for hierarchical levels 1, 2, and 3 without flattening.

In addition, it is much easier and accurate to insert the extracted model (302E) into the extracted view (300E in FIG. 3E) and the description of the extracted model (302F) into the significantly shorter netlist 300F due to its much shorter length and less complexity. In addition, it is also much easier and accurate to insert the description of a simulation model (304F) not only because of the much shorter length and less complexity of the netlist (300F) but also because of the preservation of hierarchical levels (e.g., hierarchical levels 1, 2, and 3 in this example) not pertaining to the extracted model.

Figure 4A:
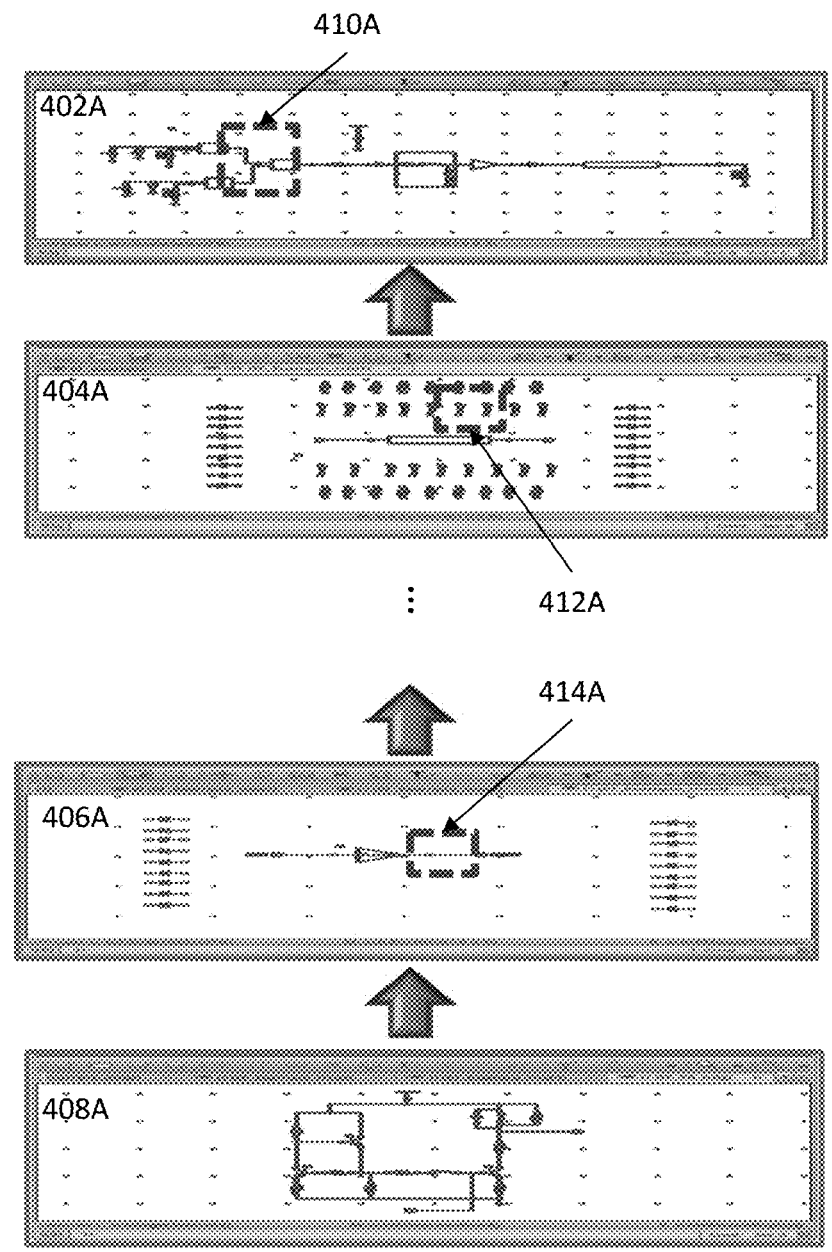
FIG. 4A illustrates an example of creating a single extracted view with extracted models located at a plurality of hierarchical levels of an electronic design in one or more embodiments.

FIG. 4A illustrates an example of creating a single extracted view with extracted models located at a plurality of hierarchical levels of an electronic design in one or more embodiments. More specifically, FIG. 4A illustrates an example electronic design having a plurality of hierarchical levels—hierarchical level 0 (402A), hierarchical level 1 (404A), . . . , hierarchical level N (406A), and the leaf hierarchical level (408A). Some techniques described herein will be applied to the example electronic design to create a single extracted view with a first extracted model 410A to represent a first set of circuit components at hierarchical level 0 (402A), a second extracted model 412A to represent a second set of circuit components at hierarchical level 1 (404A), and a third extracted model 414A to represent a third set of circuit components at hierarchical level N (406A).

Figure 4B:
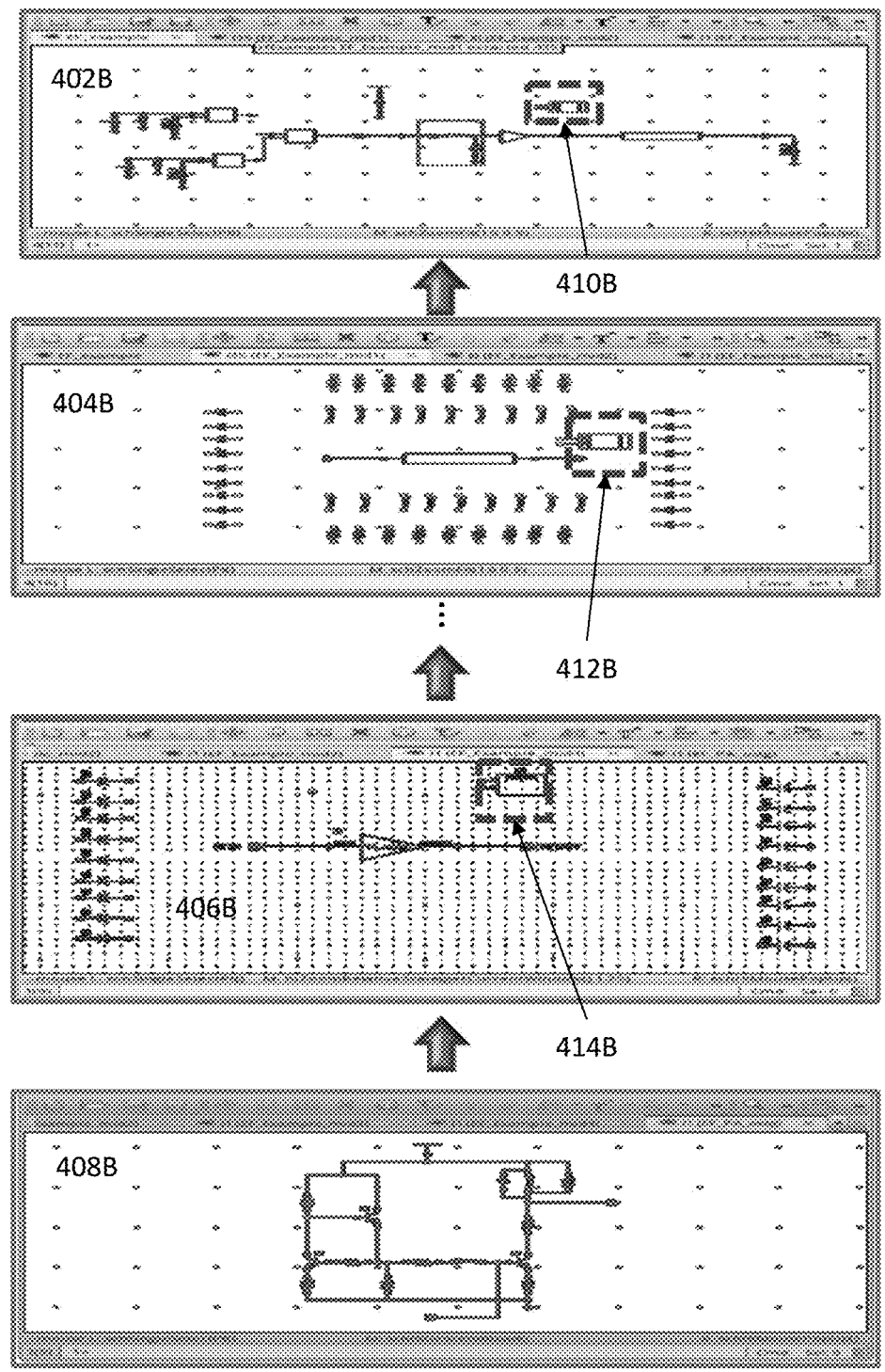
FIG. 4B illustrates an example approach that creates an extracted view by copying each hierarchical level in each design fabric of the electronic illustrated in FIG. 4A into the extracted view.

FIG. 4B illustrates an example approach that creates an extracted view by copying each hierarchical level in each design fabric of the electronic illustrated in FIG. 4A into the extracted view. More particularly, FIG. 4B illustrates a conventional approach that creates a separate extracted view for each hierarchical level in the electronic design. These conventional approaches create a first extracted view 402B by flattening the hierarchical level 0 (402A) and further modifies the first extracted view 402B by inserting the extracted model 410B that corresponds to the extracted model 410A. A second extracted view 404B is also created by flattening the hierarchical level 1 (404A) and is further modified by inserting the extracted model 412B that corresponds to the extracted model 412A.

A third extracted view 406B is further created by flattening the hierarchical level N (406A) and is further modified by inserting the extracted model 414B that corresponds to the extracted model 414A. Although the leaf hierarchical level (408A) does not pertain to any extracted models, these conventional approaches nevertheless create an extracted view 408B by flattening the leaf hierarchical level (408A) without further modifications. Some of these conventional approaches may further combine these separate extracted views into a single extracted view. Nonetheless, such a single extracted view will be cluttered with circuit components from all of the flattened hierarchical levels to reduce its readability and hence usability.

FIG. 4C illustrates an example netlist of the example approach illustrated in FIG. 4B. More particularly, FIG. 4C illustrates the resulting netlist 402C that includes all the sub-circuits in all hierarchical levels due to the non-selective flattening of each hierarchical level in the electronic design by the aforementioned conventional approaches. As described above, in addition to having a significantly longer netlist, a disadvantage of such a netlist 402C is that it is much more difficult to insert an extracted models 404C and 406C into such a netlist simply due to the size and complexity of the significantly longer netlist 402C.

Figure 4D:
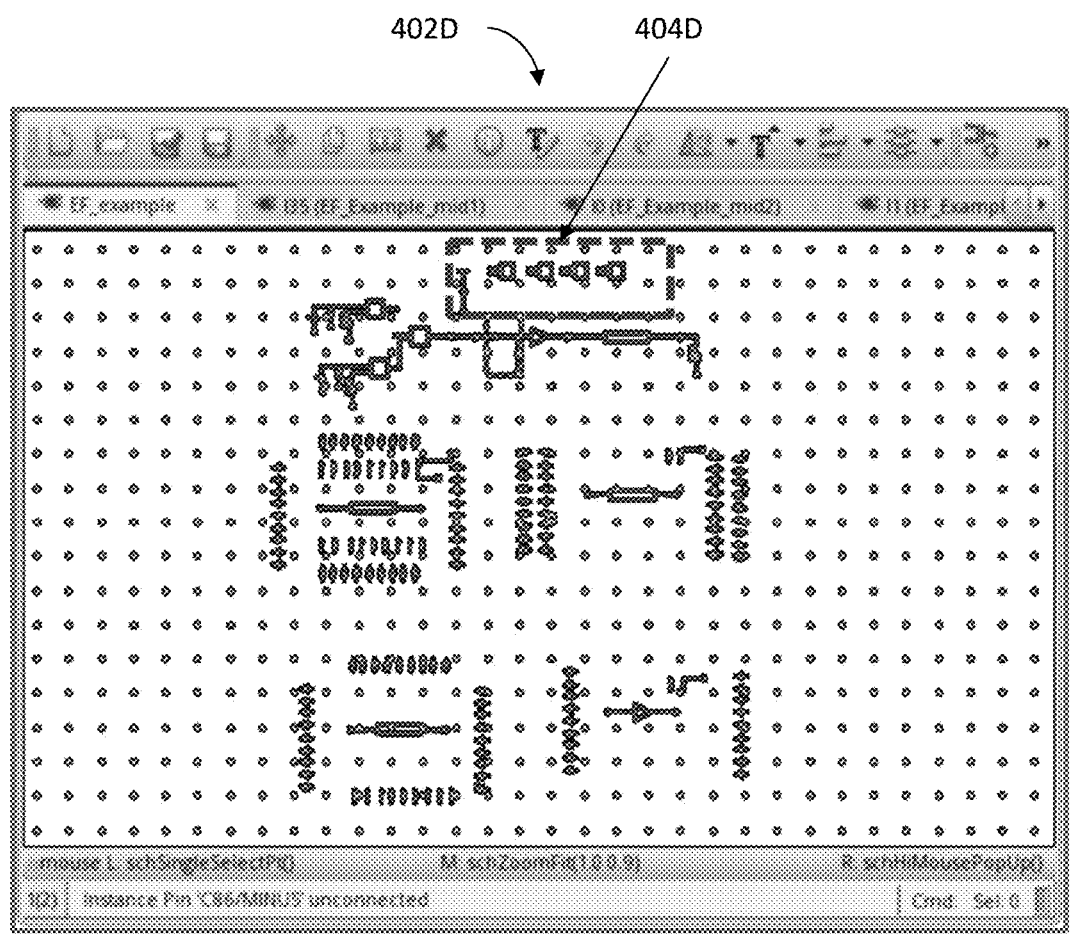
FIG. 4D illustrates an example of a single extracted view created with some of the techniques described herein in one or more embodiments.

FIG. 4D illustrates an example of a single extracted view created with some of the techniques described herein in one or more embodiments. More specifically, FIG. 4D illustrates the single extracted view 402D that is generated by some techniques described herein. In this example, hierarchical levels 0, 1, and N are identified as pertaining to one or more extracted models (e.g., 410A, 412A, and 414A in FIG. 4A) and are thus flattened into the extracted view 402D. Moreover, the extracted view 402D is further modified by incorporating an instance of each of the three extracted models (e.g., instances of 410A, 412A, and 414A) that are collectively illustrated as 404D in the extracted view 402D to represent the corresponding sets of circuit components at hierarchical level 0, 1, and N.

That is, this single extracted view 402D is generated by selectively flattening either the entire hierarchical level 0 (or level 1 or level N) or only a smaller portion (e.g., the instance to be represented by the extracted model) of the hierarchical level 0 (or level 1 or level N). In addition, the remaining leaf hierarchical level does not pertain to any extracted models and will thus be preserved and not flattened. In creating the single extracted view 402D, some embodiments flatten hierarchical levels 0, 1, and N (or a portion thereof) and reference the original schematic design for the leaf hierarchical level without flattening the leaf hierarchical level. The extracted models represented by 404D may be inserted into the extracted view 402D in an identical or substantially similar manner described above. Some embodiments may further modify the extracted view 402D by binding or associating a simulation model with a set of circuit components (e.g., a hierarchical block) at the leaf hierarchical level.

Figure 4E:
FIG. 4E illustrates an example netlist of the electronic design illustrated in FIG. 4A and created with some of the techniques described herein in one or more embodiments.

FIG. 4E illustrates an example netlist of the electronic design illustrated in FIG. 4A and created with some of the techniques described herein in one or more embodiments. More specifically, FIG. 4E illustrates the resulting netlist created by some embodiments described above with reference to FIGS. 4A and 4D. The resulting netlist 402E is much smaller and includes much fewer sub-circuits and information than the netlist 402C illustrated in FIG. 4C because these embodiments selectively flatten only hierarchical levels 0, 1, and N while preserving the original schematic designs for the remaining hierarchical levels 2 through N−1 as well as the leaf hierarchical level 408A without flattening.

In addition, it is much easier and accurate to insert the extracted model (404E) into the extracted view (402D in FIG. 4D) and the description of the extracted model (404E) into the significantly smaller netlist 402E due to its much smaller size, a fewer number of sub-circuits and less complexity. In addition, it is also much easier and accurate to insert the description of a simulation model (406E) not only because of the much smaller size and less complexity of the netlist (402E) but also because of the preservation of hierarchical levels (e.g., hierarchical levels 2-N−1 and the leaf hierarchical level in this example) not pertaining to any extracted models.

Figure 5A:
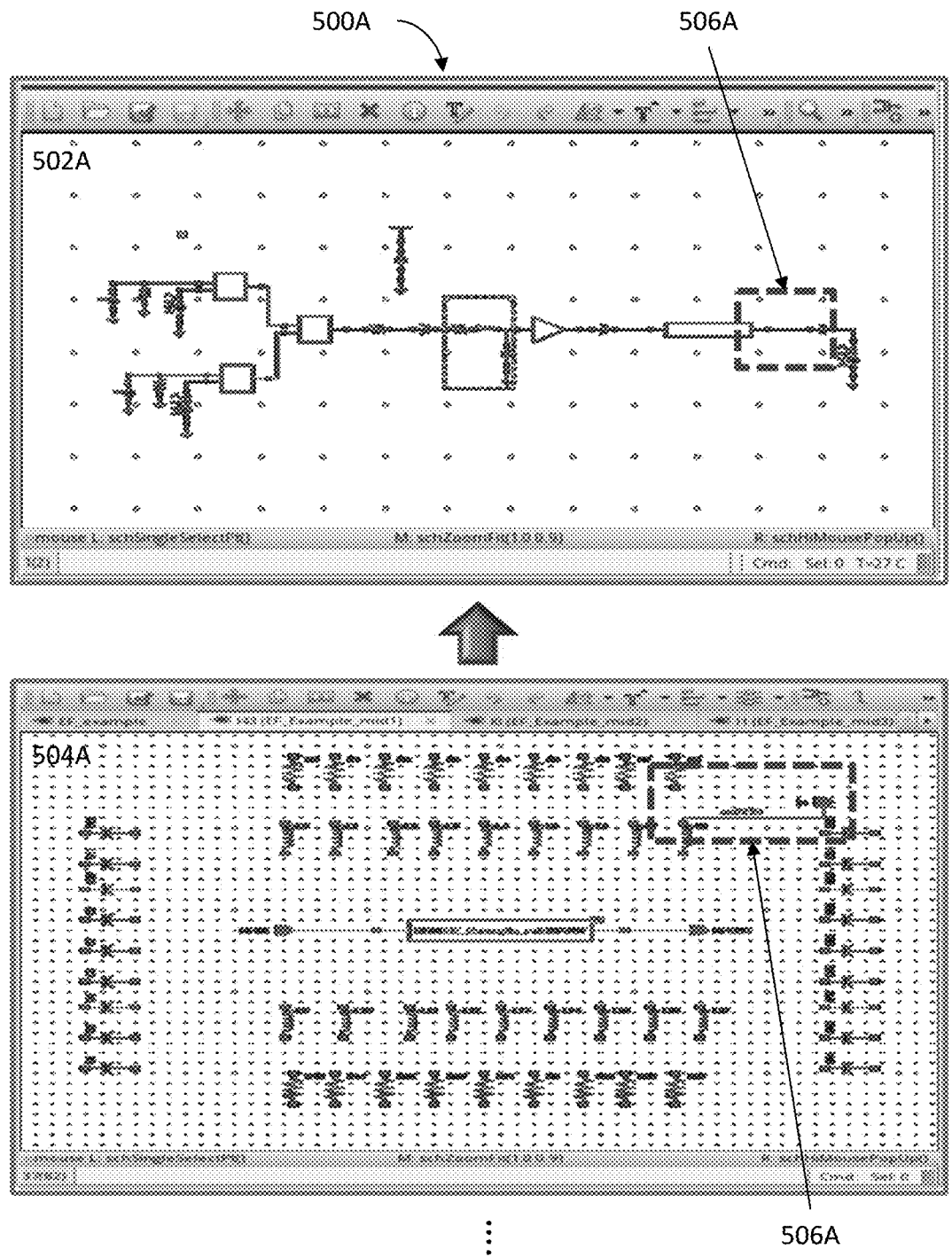
FIG. 5A illustrates an example electronic design to be modified with an extracted model that spans across multiple hierarchical levels in the electronic design in one or more embodiments.

FIG. 5A illustrates an example electronic design to be modified with an extracted model that spans across multiple hierarchical levels in the electronic design in one or more embodiments. More specifically, the example electronic design 500A includes hierarchical level 0 (502A), hierarchical level 1 (504A), and one or more remaining hierarchical levels (not shown). Some embodiments apply certain techniques described herein to generate a single extracted view for the example electronic design 500A with a first extracted model 506A that spans across hierarchical level 0 (502A) and hierarchical level 1 (504A).

Figure 5B:
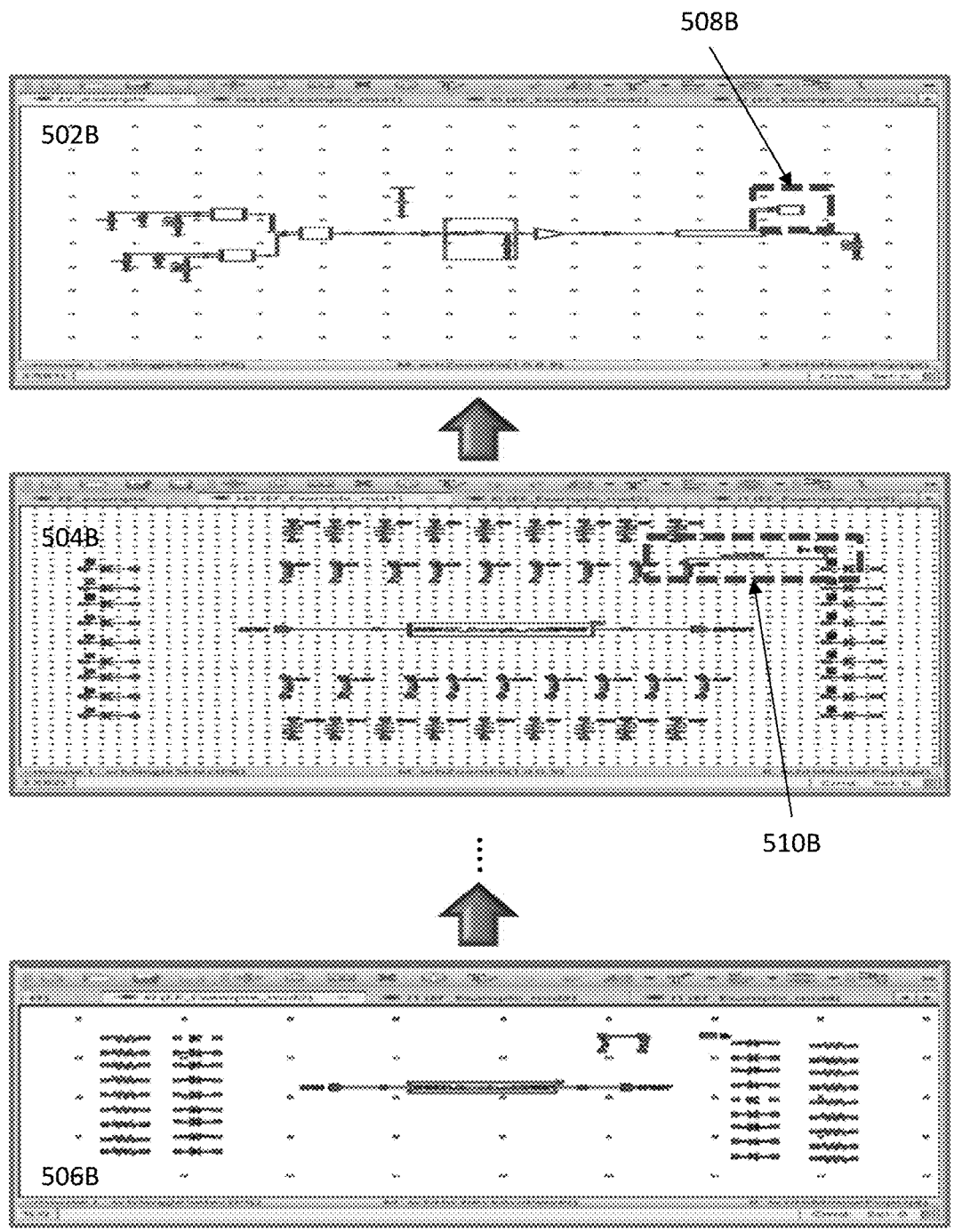
FIG. 5B illustrates some examples hierarchical levels of the schematic design for the example electronic design illustrated in FIG. 5A in one or more embodiments.

FIG. 5B illustrates some examples hierarchical levels of the schematic design for the example electronic design illustrated in FIG. 5A in one or more embodiments. More specifically, FIG. 5B illustrates a conventional approach that creates a separate extracted view for each hierarchical level in the electronic design (500A in FIG. 5A). These conventional approaches create a first extracted view 502B by flattening the hierarchical level 0 (502A) and further modifies the first extracted view 502B by inserting the extracted model instance 508B (e.g., an instance of the extracted model 506A in FIG. 5A) that corresponds to the extracted model 506A. A second extracted view 504B is also created by flattening the hierarchical level 1 (504A) and is further modified by inserting the extracted model instance 5106 that corresponds to the extracted model 506A in the hierarchical level 1 (504A in FIG. 5A).

Although the n-th hierarchical level (506B) does not pertain to any extracted models to be incorporated in any extracted views, these conventional approaches nevertheless create a separate extracted view 506B by flattening the n-th hierarchical level (506B) without further modifications. Some of these conventional approaches may further combine these separate extracted views into a single extracted view. Nonetheless, such a single extracted view will be cluttered with circuit components from all of the flattened hierarchical levels to reduce its readability and hence usability.

Figure 5C:
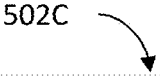
FIG. 5C illustrates an example netlist encompassing the extracted model spanning across multiple hierarchical levels for a single extracted view generated for the example electronic design illustrated in FIG. 5A with some of the techniques described herein in one or more embodiments.

FIG. 5C illustrates an example netlist encompassing the extracted model spanning across multiple hierarchical levels for a single extracted view generated for the example electronic design illustrated in FIG. 5A with some of the techniques described herein in one or more embodiments. More particularly, FIG. 5C illustrates the resulting netlist 502C that includes all the sub-circuits in all hierarchical levels of the electronic design (500A in FIG. 5A) due to the non-selective flattening of each hierarchical level in the electronic design by the aforementioned conventional approaches. As described above, in addition to having a significantly larger netlist (502C), a disadvantage of such a netlist 502C is that it is much more difficult to insert the corresponding information 504C of the extracted model instance (508B in extract view 502B and 5106 in extracted view 504B) into such a netlist simply due to the much larger size and higher complexity of the significantly longer netlist 502C.

Figure 5D:
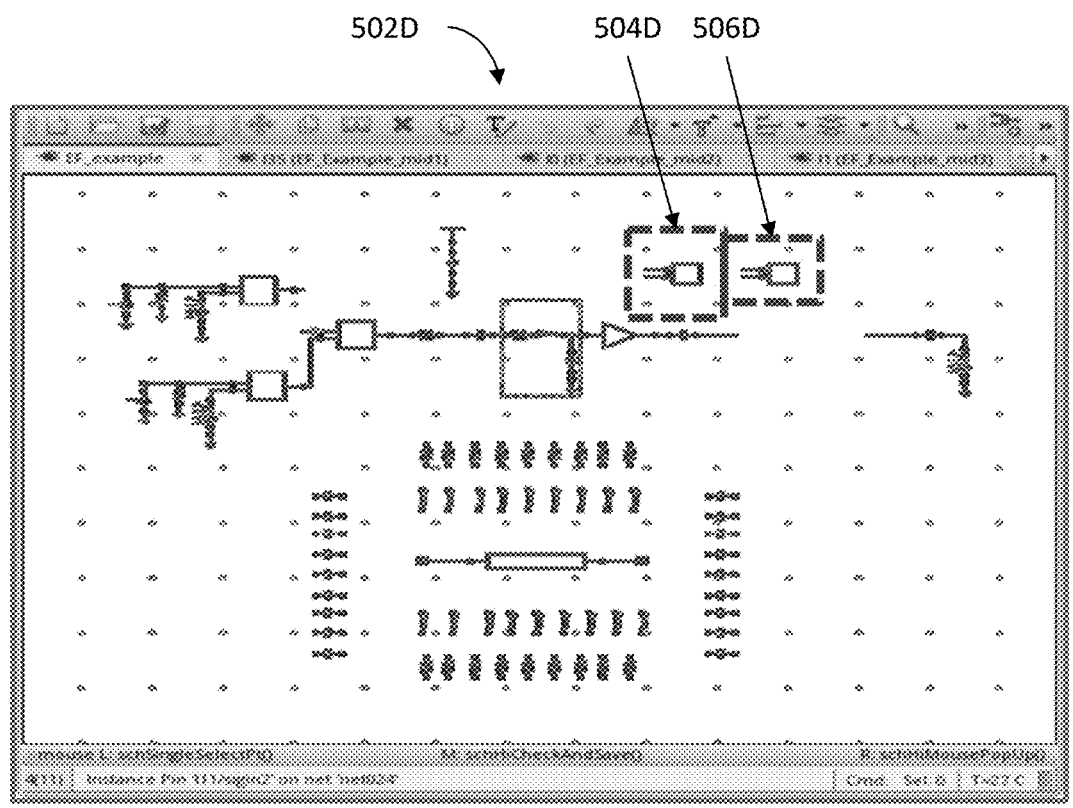
FIG. 5D illustrates a single example extracted view encompassing the extracted model spanning across multiple hierarchical levels and created by using some of the techniques described herein in one or more embodiments.

FIG. 5D illustrates a single example extracted view encompassing the extracted model spanning across multiple hierarchical levels and created by using some of the techniques described herein in one or more embodiments. More specifically, FIG. 5D illustrates the single extracted view 502D that is generated by some techniques described herein. In this example, hierarchical level 0 (502A in FIG. 5A) and hierarchical level 1 (504A in FIG. 5A) are identified as pertaining to the extracted model (506A in FIG. 5A) that spans across these two hierarchical levels.

To determine which hierarchical level is to be flattened, some embodiments invoke, for example, a level detection module that examines an extracted model (or the corresponding set of circuit components) to obtain information about its port(s), terminal(s), or pin(s) that interfaces with external circuitry. The connectivity information (e.g., layout connectivity, or schematic connectivity, etc.) is then examined to identify the net or nets connected to the external model instance (or the corresponding set of circuit components). The level detection module may then trace the net or nets to determine whether the net or nets cross the boundary of a hierarchical level a design fabric.

In some other embodiments, a design editor (e.g., a schematic editor) may be invoked to determine the set of schematic circuit components in the schematic(s) corresponding to an extracted model and to examine the hierarchical structure corresponding to the set of schematic circuit components to determine the schematic hierarchical level or levels that the set of schematic circuit components exists for the determination of schematic hierarchical level(s) to be flattened.

In some other embodiments, a design editor (e.g., a layout editor) may be invoked to determine the set of layout circuit components in the layout(s) corresponding to an extracted model and to examine the hierarchical structure corresponding to the set of layout circuit components to determine the hierarchical level or levels that the set of layout circuit components exists. The schematic level or levels corresponding to the determined layout hierarchical level or levels may then be determined based at least in part on the mapping relationship between schematics and layouts and may then be used for the determination of hierarchical level(s) to be flattened.

These two hierarchical levels are thus selectively flattened into the single extracted view 502D. Moreover, the single extracted view 502D is further modified by incorporating the corresponding instance 504D of the extracted model 506A that partially resides at hierarchical level 0 (502A in FIG. 5A). In addition, the single extracted view 502D is further modified by incorporating the corresponding instance 506D of the extracted model 506A that partially resides at hierarchical level 1 (504A in FIG. 5A). These two instances 504D and 506D may thus be inserted, placed, and/or interconnected in the single extracted view 502D to represent the corresponding sets of circuit components at hierarchical level 0 and hierarchical level 1 across which the extracted model spans.

That is, this single extracted view 502D is generated by selectively flattening either the entire hierarchical levels 0 and 1 or only a smaller portion (e.g., the instance(s) to be represented by the extracted model) of the hierarchical level 0 (502A in FIG. 5A) and/or hierarchical level 1 (504A in FIG. 5A). In addition, the remaining hierarchical levels (e.g., the leaf hierarchical level) do not pertain to any extracted models and will thus be preserved and not flattened in these embodiments. In creating the single extracted view 502D, some embodiments flatten hierarchical levels 0 and 1 (or a portion thereof) and reference the original schematic design for the remaining hierarchical levels not pertaining to any extracted models without flattening these remaining hierarchical levels. The extracted model instances illustrated as 504D and 506D may be inserted into the extracted view 502D in an identical or substantially similar manner described above. Some embodiments may further modify the extracted view 502D by binding or associating a simulation model (not shown) with a set of circuit components (e.g., a hierarchical block) at a remaining hierarchical level not pertaining to extracted models.

Figure 5E:
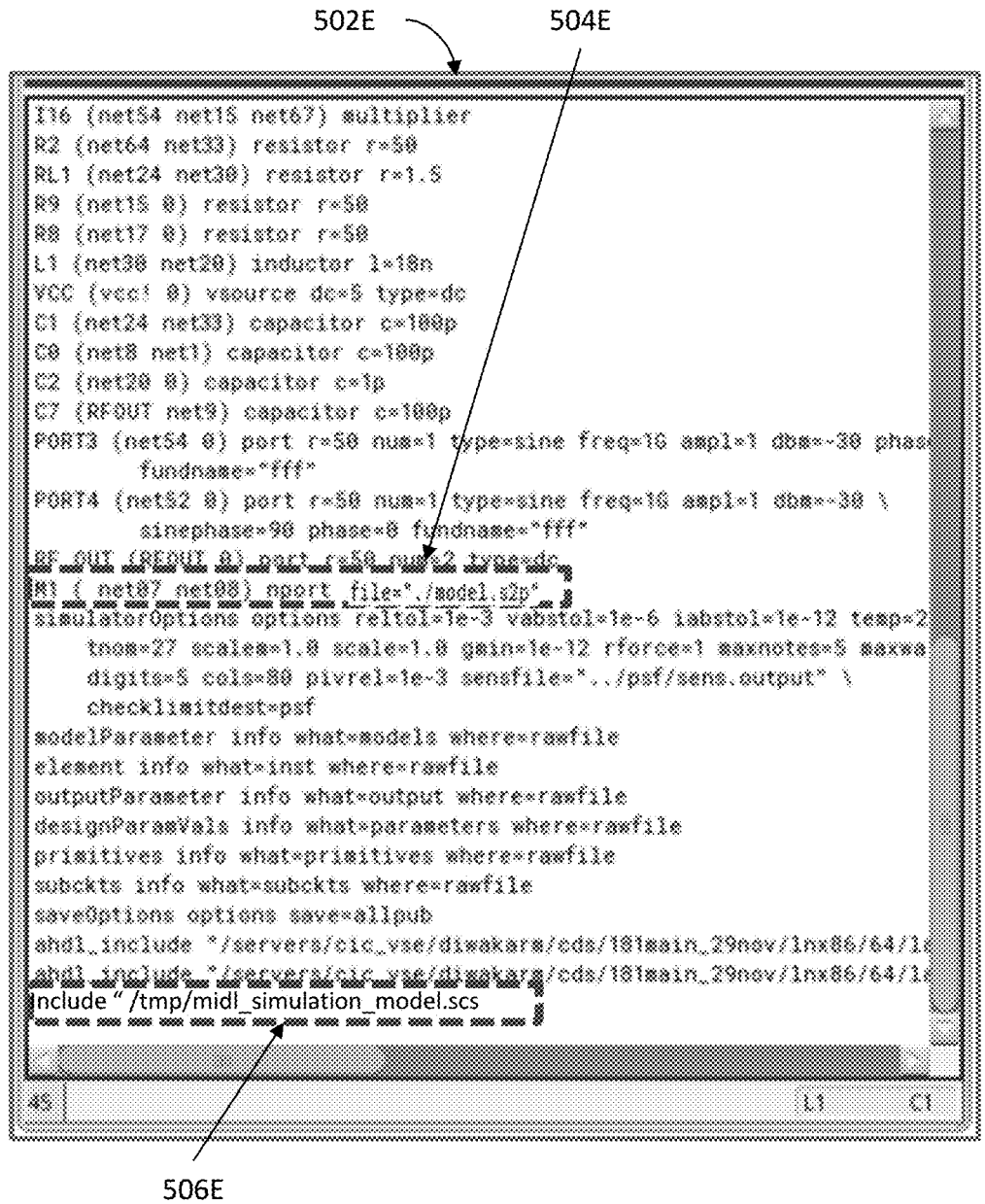
FIG. 5E illustrates an example netlist of the electronic design illustrated in FIG. 5A and created with some of the techniques described herein in one or more embodiments.

FIG. 5E illustrates an example netlist of the electronic design illustrated in FIG. 5A and created with some of the techniques described herein in one or more embodiments. More specifically, FIG. 5E illustrates the resulting netlist created by some embodiments described above with reference to FIGS. 5A and 5D. The resulting netlist 502E is much smaller in size because it includes much fewer sub-circuits and information than the netlist 502C illustrated in FIG. 5C because these embodiments selectively flatten only hierarchical levels 0 and 1 while preserving the original schematic designs for the remaining hierarchical levels (e.g., the leaf hierarchical level) without flattening these remaining hierarchical levels.

In addition, it is much easier and accurate to insert the extracted model (504E) into the extracted view (502D in FIG. 5D) and the description (504E) of the extracted model into the significantly smaller netlist 502E due to its much smaller size, a fewer number of sub-circuits, and lower complexity. In addition, it is also much easier and accurate to insert the description of a simulation model (506E) not only because of the much smaller size and lower complexity of the netlist (502E) but also because of the preservation of hierarchical levels (e.g., the leaf hierarchical level in this example) not pertaining to any extracted models.

Figure 6A:
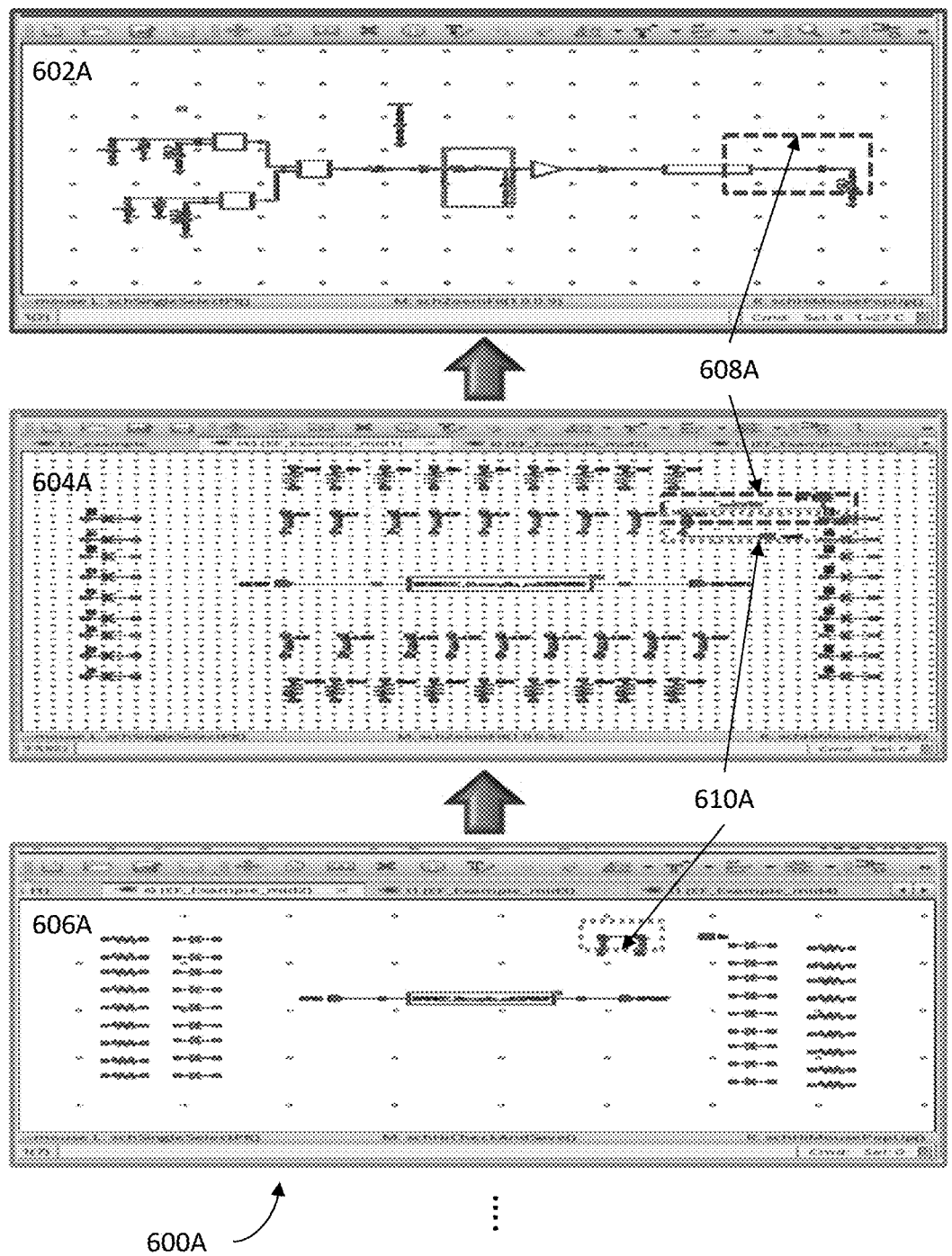
FIG. 6A illustrates an example electronic design to be modified with extracted models that span across multiple hierarchical levels and overlap with each other in the electronic design in one or more embodiments.

FIG. 6A illustrates an example electronic design to be modified with extracted models that span across multiple hierarchical levels and overlap with each other in the electronic design in one or more embodiments. More specifically, the example electronic design 600A includes hierarchical level 0 (602A), hierarchical level 1 (604A), hierarchical level 2 (606A), and one or more remaining hierarchical levels (not shown).

Some embodiments apply certain techniques described herein to generate a single extracted view for the example electronic design 600A with a first extracted model 608A that spans across hierarchical level 0 (602A) and hierarchical level 1 (604A) as well as a second extracted model 610A that spans across hierarchical level 1 (604A) and hierarchical level 2 (606A). Moreover, the first extracted model 608A and the second extracted model 610A partially overlap each other at the first hierarchical level (604A).

Figure 6B:
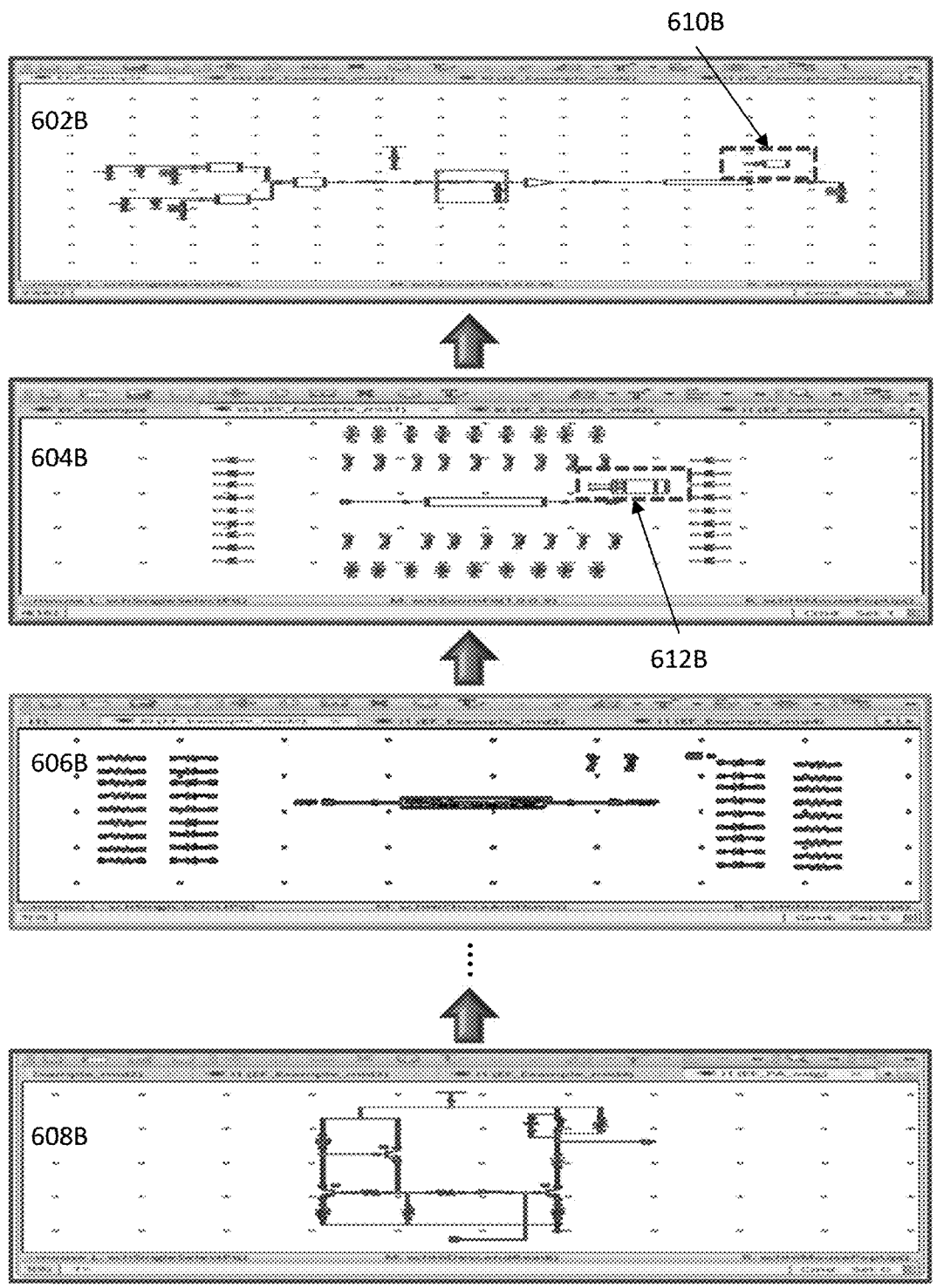
FIG. 6B illustrates extracted views generated for each hierarchical level of the example electronic design illustrated in FIG. 6A.

FIG. 6B illustrates extracted views generated for each hierarchical level of the example electronic design illustrated in FIG. 6A. More specifically, FIG. 6B illustrates a conventional approach that creates a separate extracted view for each hierarchical level in the electronic design (600A in FIG. 6A). To handle an extracted model instance spanning across multiple hierarchical levels, conventional approaches may simply flatten multiple hierarchical levels in generating an extracted view for a hierarchical level.

For example, these conventional approaches create a first extracted view 602B by flattening the hierarchical level 0 (602A in FIG. 6A) and hierarchical level 1 (604A in FIG. 1) and further modifies the first extracted view 602B by inserting the extracted model instance 610B (e.g., an instance of the extracted model 608A in FIG. 6A) at hierarchical level 0. Similarly, a second extracted view 604B is created by flattening the hierarchical level 1 (604A in FIG. 6A) and hierarchical level 2 (606A in FIG. 6A) to accommodate the extracted model instance spanning across these two hierarchical levels. These conventional approaches then modify the second extracted view 604B by inserting the extracted model instance 612B into the extracted view 604B.

Moreover, although hierarchical level 2 (606A in FIG. 6A) has been flattened to accommodate the extracted view instance 612B spanning across hierarchical levels 1 and 2 during the creation of the extracted view 604B, conventional approaches nevertheless create a third extracted view 606B for the second hierarchical level (606A in FIG. 6A) because these conventional approaches non-selectively create a separate extracted view for each hierarchical level by flattening the respective hierarchical level.

In addition, although hierarchical level N does not pertain to any of the aforementioned extracted model instances (e.g., 610B, 612B, and 614B), these conventional approaches still generate an extracted view 608B for this N-th hierarchical level because conventional approaches simply generate an extracted view for each hierarchical level by flattening each hierarchical level in a non-selective fashion, regardless of whether a hierarchical level needs to be flattened.

Some of these conventional approaches may further combine these separate extracted views into a single extracted view. Nonetheless, such a single extracted view will be cluttered with circuit components from all of the flattened hierarchical levels to reduce its readability and hence usability.

FIG. 6C illustrates an example netlist for the extracted views generated for each of the hierarchical levels in the example electronic design illustrated in FIG. 6A. More particularly, FIG. 6C illustrates the resulting netlist 602C that includes all the sub-circuits in all hierarchical levels of the electronic design (600A in FIG. 6A) due to the non-selective flattening of and creation of a separate extracted view for each hierarchical level in the electronic design by the aforementioned conventional approaches. As described above, in addition to having a significantly larger netlist (602C), a disadvantage of such a netlist 602C is that it is much more difficult to insert the corresponding information 604C and 606C of the extracted model instances (e.g., 610B in the extract view 602B and the extracted model instance 612B in extracted view 604B) into such the netlist 602C simply due to the much larger size and higher complexity of the significantly longer netlist 602C.

Figure 6D:
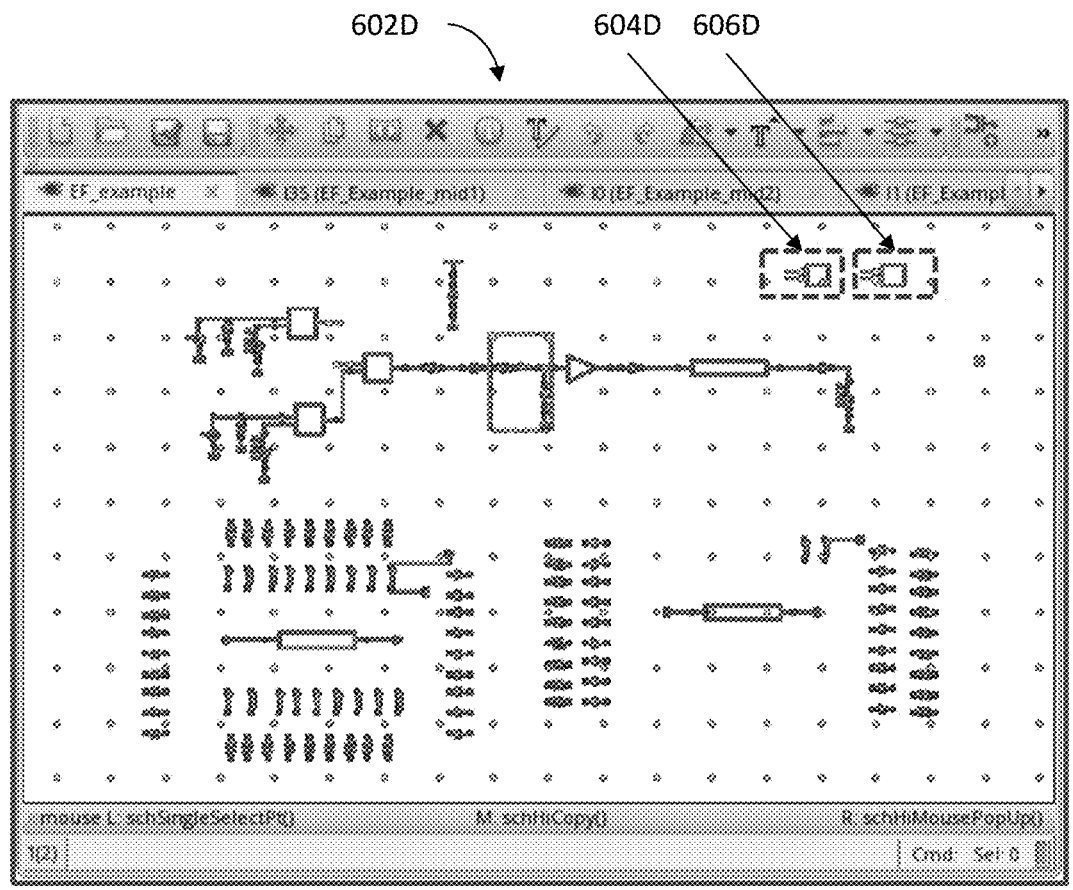
FIG. 6D illustrates a single example extracted view encompassing the extracted models overlapping each other and created by using some of the techniques described herein in one or more embodiments.

FIG. 6D illustrates a single example extracted view encompassing the extracted models overlapping each other and created by using some of the techniques described herein in one or more embodiments. More specifically, FIG. 6D illustrates the single extracted view 602D that is generated by some techniques described herein. In this example, hierarchical level 0 (602A in FIG. 6A), hierarchical level 1

(604A in FIG. 6A), and hierarchical level 2 (606A in FIG. 6A) are identified as pertaining to the extracted models (608A and 610A in FIG. 6A) because these two extracted models span across these hierarchical levels.

An extracted view generation module may thus generate the single extracted view 602D by flattening hierarchical levels 0, 1, and 2 while preserving the remaining hierarchical levels. More particularly, the schematic circuit components at hierarchical levels 0, 1, and 2 are promoted by the flattening process and propagated into the single extracted view 602D while the original schematic designs corresponding to the remaining hierarchical levels are preserved and referenced in the extracted view 602D.

Figure 6E:
FIG. 6E illustrates an example netlist of the electronic design illustrated in FIG. 6A and created with some of the techniques described herein in one or more embodiments.

FIG. 6E illustrates an example netlist of the electronic design illustrated in FIG. 6A and created with some of the techniques described herein in one or more embodiments. More specifically, FIG. 6E illustrates the resulting netlist created by some embodiments described above with reference to FIGS. 6A and 6D. The resulting netlist 602E is much smaller in size because it includes much fewer sub-circuits and information than the netlist 602C illustrated in FIG. 6C. The smaller size and lower complexity are a result of the selective flattening of only hierarchical levels 0, 1, and 2 while preserving the original schematic designs for the remaining hierarchical levels (e.g., the leaf hierarchical level) that do not pertain to the aforementioned extracted models, without flattening these remaining hierarchical levels.

In addition, it is much easier and accurate to insert the extracted model instances (604D and 606D in FIG. 6D) into the extracted view (602D in FIG. 6D) and the description (604E) of the extracted model instances into the significantly smaller netlist 602E due to its much smaller size, a fewer number of sub-circuits, and lower complexity. In addition, it is also much easier and accurate to insert the description (606E) of a simulation model into the netlist (602E) not only because of the smaller size and lower complexity of the netlist (602E) but also because of the preservation of original schematic designs for the hierarchical levels (e.g., the N-th hierarchical level in this example) not pertaining to any of the aforementioned extracted models.

System Architecture Overview

Figure 7:
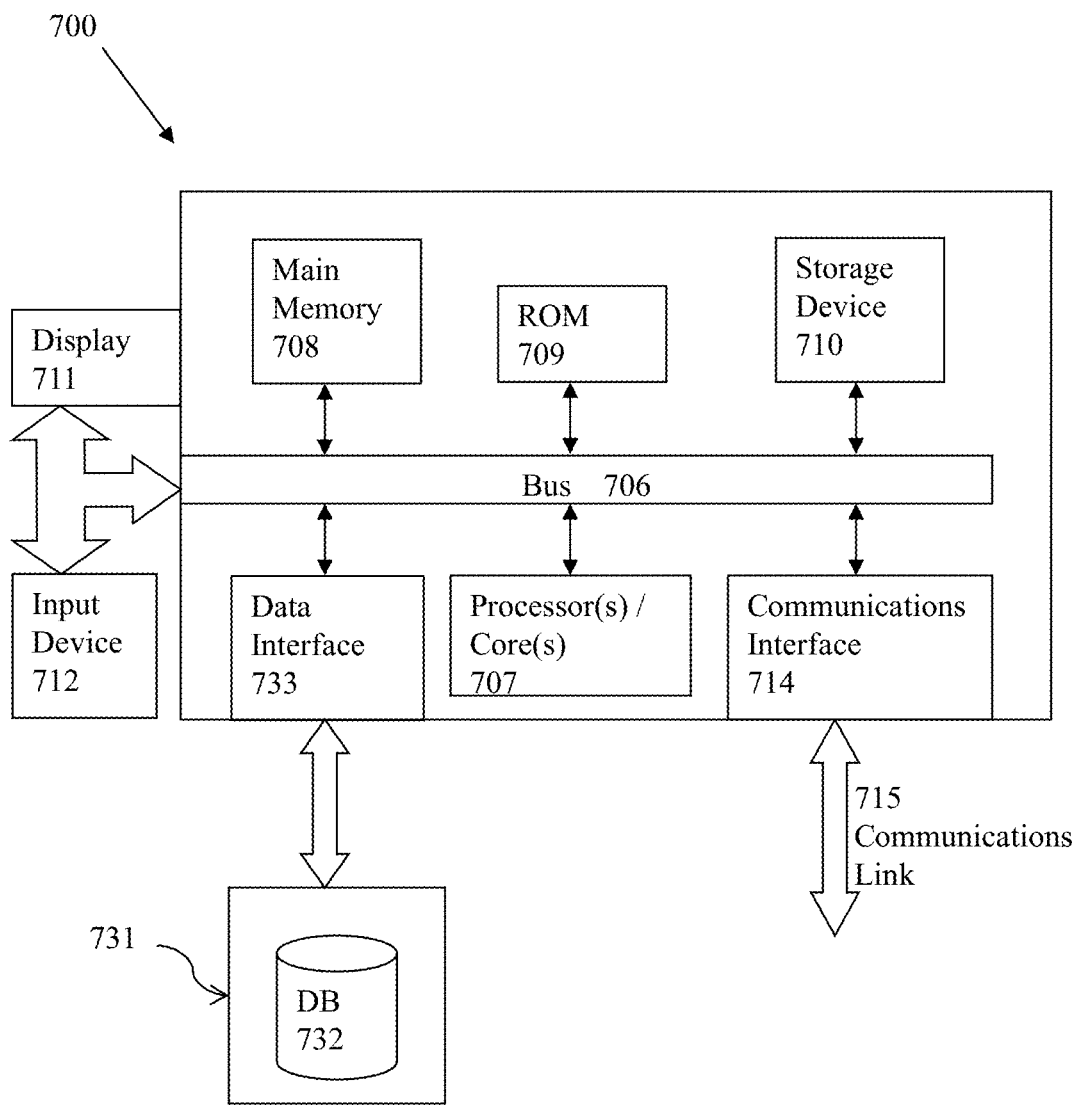
FIG. 7 illustrates a computerized system on which a method for characterizing an electronic design with a schematic driven extracted view may be implemented.

FIG. 7 illustrates a computerized system on which a method for characterizing an electronic design with a schematic driven extracted view may be implemented. Computer system 700 includes a bus 706 or other communication module for communicating information, which interconnects subsystems and devices, such as processor 707, system memory 708 (e.g., RAM), static storage device 709 (e.g., ROM), disk drive 710 (e.g., magnetic or optical), communication interface 714 (e.g., modem or Ethernet card), display 711 (e.g., CRT or LCD), input device 712 (e.g., keyboard), and cursor control (not shown).

The illustrative computing system 700 may include an Internet-based computing platform providing a shared pool of configurable computer processing resources (e.g., computer networks, servers, storage, applications, services, etc.) and data to other computers and devices in a ubiquitous, on-demand basis via the Internet in some embodiments. For example, the computing system 700 may include or may be a part of a cloud computing platform (e.g., a public cloud, a hybrid cloud, etc.) where computer system resources (e.g., storage resources, computing resource, etc.) are provided on an on-demand basis, without direct, active management by the users in some embodiments. In some embodiments, the illustrative computing system 700 may be devised providing According to one embodiment, computer system 700 performs specific operations by one or more processor or processor cores 707 executing one or more sequences of one or more instructions contained in system memory 708. Such instructions may be read into system memory 708 from another computer readable/usable storage medium, such as static storage device 709 or disk drive 710. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 707, where the one or more processors, one or more processor cores, or combination thereof executes one or more threads. For example, the acts of determination, extraction, simulating, annotating, analyzing, optimizing, and/or identifying, etc. descried herein may be performed by one or more processors, one or more processor cores, or combination thereof.

The term "computer readable storage medium" or "computer usable storage medium" as used herein refers to any non-transitory medium that participates in providing instructions to processor 707 for execution. Such a medium may take many forms, including but not limited to, non-volatile media and volatile media. Non-volatile media includes, for example, optical or magnetic disks, such as disk drive 710. Volatile media includes dynamic memory, such as system memory 708. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 700. According to other embodiments of the invention, two or more computer systems 700 coupled by communication link 715 (e.g., LAN, PTSN, or wireless network) may perform the sequence of instructions required to practice the invention in coordination with one another.

Computer system 700 may transmit and receive messages, data, and instructions, including program (e.g., application code) through communication link 715 and communication interface 714. Received program code may be executed by processor 707 as it is received, and/or stored in disk drive 710, or other non-volatile storage for later execution. In an embodiment, the computer system 700 operates in conjunction with a data storage system 731, e.g., a data storage system 731 that includes a database 732 that is readily accessible by the computer system 700. The computer system 700 communicates with the data storage system 731 through a data interface 733. A data interface 733, which is coupled to the bus 706 (e.g., memory bus, system bus, data bus, etc.), transmits and receives electrical, electromagnetic or optical signals that include data streams representing various types of signal information, e.g., instructions, messages and data. In embodiments of the invention, the functions of the data interface 733 may be performed by the communication interface 714.

Various embodiments described herein provide the capability of handling electronic design spanning across multiple design fabrics, each having one or more hierarchical levels and also accommodate different process design kits (PDKs) for different electronic designs. In addition, the described embodiments handle any extracted model spanning across multiple design fabrics. Moreover, for each design fabric, these embodiments need not make a copy of the entire design hierarchy for creating an extracted view. These embodiments also determine an optimal hierarchical level in an electronic design (mono-fabric or cross-fabric) to which the copy of the schematic hierarchy is to be made. These embodiments further provide the capability of reusing existing simulation models for one or more sets of circuit components (e.g., a hierarchical block). Furthermore, these embodiments generate an extracted view where an optimal hierarchical level is determined for each design fabric. As a result, the embodiments described herein fully address the problems with and shortcomings of conventional approaches and drastically improve and expand the capability of conventional approaches.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for characterizing an electronic design with a schematic driven extracted view, comprising:
    identifying a schematic of an electronic design, wherein the schematic exists in one or more design fabrics;
    determining an extracted model for characterizing a behavior of the electronic design based at least in part upon the schematic;
    determining a hierarchical level pertaining to the extracted model in a design fabric of the one or more design fabrics of the schematic; and
    determining a hierarchical level in a design fabric of the one or more design fabrics of the schematic as a target for flattening for the extracted model; and
    characterizing the electronic design with at least an extracted view that is determined at least by completely or partially flattening the hierarchical level in the design fabric.

2. The computer implemented method of claim 1, wherein identifying the schematic of the electronic design comprises:
    identifying one or more schematic hierarchical structures for the schematic in the one or more design fabrics;
    identifying one or more layouts and/or one or more layout hierarchical structures that respectively correspond to the one or more design fabrics; and
    identifying connectivity information that pertain to the schematic or the one or more layouts.

3. The computer implemented method of claim 1, wherein determining the hierarchical level in the design fabric of the one or more design fabrics of the schematic comprises:
    identifying connectivity information of the electronic design;
    identifying one or more hierarchical structures that correspond to the one or more design fabrics;
    identifying a set of schematic circuit components that corresponds to the extracted model; and
    determining the hierarchical level or a portion of the hierarchical level in a design fabric of the one or more design fabrics for the set of schematic circuit components based at least in part upon the connectivity information.

4. The computer implemented method of claim 3, wherein determining the hierarchical level in the design fabric of the one or more design fabrics of the schematic comprises:
    identifying one or more hierarchical structures in the one or more design fabrics of the electronic design; and
    identifying a terminal, a pin, or a port of the set of schematic circuit components.

5. The computer implemented method of claim 4, wherein determining an extracted model further comprises:
    generating a correlation result between the set of schematic circuit components and the extracted model at least by correlating the terminal, the pin, or the port of the set of schematic circuit components to a model terminal, a model pin, or a model port of the extracted model; and
    determining the hierarchical level or the portion of the hierarchical level in the design fabric of the one or more design fabrics for the set of schematic circuit components based further at least in part upon the one or more hierarchical structures or the correlation result.

6. The computer implemented method of claim 1, wherein determining the extracted model comprising:
    identifying an input stimulus to a circuit of interest in the electronic design;
    determining a transfer characteristic of the circuit of interest in response to the input stimulus; and
    identifying a relation between one or more electrical characteristics of the circuit of interest.

7. The computer implemented method of claim 6, wherein determining the extracted model further comprising:
    evaluating the relation against the transfer characteristic to generate an evaluation result; and
    determining the extracted model based at least in part upon the evaluation result.

8. The computer implemented method of claim 1, further comprising:
    flattening the hierarchical level into the extracted view while preserving a first hierarchical level that does not pertain to extracted models in the electronic design; and
    preserving an original schematic design of the first hierarchical level in the schematic of the electronic design without flattening the first hierarchical level into the extracted view.

9. The computer implemented method of claim 8, further comprising:
    populating contents of the original schematic design of the first hierarchical level into the extracted view; and
    binding the extracted model with the extracted view at least by interconnecting the extracted model in the extracted view based at least in part upon first connectivity information of the electronic design.

10. The computer implemented method of claim 9, further comprising:

identifying a simulation model for characterizing the electronic design with at least an extracted view;

determining a hierarchical block at the first hierarchical level based at least in part upon the simulation model; and binding the simulation model with the extracted view at least by interconnecting the simulation model in the extracted view based at least in part upon second connectivity information of the electronic design.

11. A system for characterizing an electronic design with a schematic driven extracted view, comprising:

a microprocessor; and a non-transitory computer accessible storage medium storing thereupon a sequence of instructions which, when executed by the microprocessor, causes the microprocessor at least to:

identify a schematic of an electronic design, wherein the schematic exists in one or more design fabrics;

determine an extracted model for characterizing a behavior of the electronic design based at least in part upon the schematic;

determine a hierarchical level pertaining to the extracted model in a design fabric of the one or more design fabrics of the schematic; and characterize the electronic design with at least an extracted view that is determined at least by completely or partially flattening the hierarchical level in the design fabric while preserving a separate hierarchical level in the one or more design fabrics of the schematic.

12. The system for claim 11, wherein the sequence of instructions which, when executed by the microprocessor, causes the microprocessor to identify the schematic of the electronic design further comprises instructions whose execution further causes the microprocessor to:

identify one or more schematic hierarchical structures for the schematic in the one or more design fabrics;

identify one or more layouts and/or one or more layout hierarchical structures that respectively correspond to the one or more design fabrics; and identify connectivity information that pertain to the schematic or the one or more layouts.

13. The system for claim 11, wherein the sequence of instructions which, when executed by the microprocessor, causes the microprocessor to determine the hierarchical level in the design fabric further comprises instructions whose execution further causes the microprocessor to:

identifying connectivity information of the electronic design;

identify one or more hierarchical structures that correspond to the one or more design fabrics;

identify a set of schematic circuit components that corresponds to the extracted model;

determine the hierarchical level or a portion of the hierarchical level in a design fabric of the one or more design fabrics for the set of schematic circuit components based at least in part upon the connectivity information;

identify one or more hierarchical structures in the one or more design fabrics of the electronic design;

identify a terminal, a pin, or a port of the set of schematic circuit components;

generate a correlation result between the set of schematic circuit components and the extracted model at least by correlating the terminal, the pin, or the port of the set of schematic circuit components to a model terminal, a model pin, or a model port of the extracted model; and determine the hierarchical level or the portion of the hierarchical level in the design fabric of the one or more design fabrics for the set of schematic circuit components based further at least in part upon the one or more hierarchical structures or the correlation result.

14. The system for claim 11, wherein the sequence of instructions which, when executed by the microprocessor, causes the microprocessor to determining the extracted model further comprises instructions whose execution further causes the microprocessor to:

identify an input stimulus to a circuit of interest in the electronic design;

determine a transfer characteristic of the circuit of interest in response to the input stimulus;

identify a relation between one or more electrical characteristics of the circuit of interest;

evaluate the relation against the transfer characteristic to generate an evaluation result; and determine the extracted model based at least in part upon the evaluation result.

15. The system for claim 11, wherein the sequence of instructions which, when executed by the microprocessor, further causes the microprocessor to:

flatten the hierarchical level into the extracted view while preserving a first hierarchical level that does not pertain to extracted models in the electronic design;

preserve an original schematic design of the first hierarchical level in the schematic of the electronic design without flattening the first hierarchical level into the extracted view;

populating contents of the original schematic design of the first hierarchical level into the extracted view;

binding the extracted model with the extracted view at least by interconnecting the extracted model in the extracted view based at least in part upon first connectivity information of the electronic design;

identifying a simulation model for characterizing the electronic design with at least an extracted view;

determining a hierarchical block at the first hierarchical level based at least in part upon the simulation model; and binding the simulation model with the extracted view at least by interconnecting the simulation model in the extracted view based at least in part upon second connectivity information of the electronic design.

16. An article of manufacture comprising a non-transitory computer accessible storage medium having stored thereupon a sequence of instructions which, when executed by at least one processor or at least one processor core executing one or more threads, causes the at least one processor or the at least one processor core to perform a set of acts for characterizing an electronic design with a schematic driven extracted view, the set of acts comprising:

identifying a schematic of an electronic design, wherein the schematic exists in one or more design fabrics;

determining an extracted model for characterizing a behavior of the electronic design based at least in part upon the schematic;

determining a hierarchical level pertaining to the extracted model in a design fabric of the one or more design fabrics of the schematic; and characterizing the electronic design with at least an extracted view that is determined at least by completely or partially flattening the hierarchical level in the design fabric while preserving a separate hierarchical level in the one or more design fabrics of the schematic.

17. The article of manufacture of claim 16, the set of acts further comprising:
    identifying one or more schematic hierarchical structures for the schematic in the one or more design fabrics;
    identifying one or more layouts and/or one or more layout hierarchical structures that respectively correspond to the one or more design fabrics; and
    identifying connectivity information that pertain to the schematic or the one or more layouts.

18. The article of manufacture of claim 16, the set of acts further comprising:
    identifying connectivity information of the electronic design;
    identifying one or more hierarchical structures that correspond to the one or more design fabrics;
    identifying a set of schematic circuit components that corresponds to the extracted model;
    determining the hierarchical level or a portion of the hierarchical level in a design fabric of the one or more design fabrics for the set of schematic circuit components based at least in part upon the connectivity information;
    identifying one or more hierarchical structures in the one or more design fabrics of the electronic design;
    identifying a terminal, a pin, or a port of the set of schematic circuit components;
    generating a correlation result between the set of schematic circuit components and the extracted model at least by correlating the terminal, the pin, or the port of the set of schematic circuit components to a model terminal, a model pin, or a model port of the extracted model; and
    determining the hierarchical level or the portion of the hierarchical level in the design fabric of the one or more design fabrics for the set of schematic circuit components based further at least in part upon the one or more hierarchical structures or the correlation result.

19. The article of manufacture of claim 16, the set of acts further comprising:
    identifying an input stimulus to a circuit of interest in the electronic design;
    determining a transfer characteristic of the circuit of interest in response to the input stimulus;
    identifying a relation between one or more electrical characteristics of the circuit of interest;
    evaluating the relation against the transfer characteristic to generate an evaluation result; and
    determining the extracted model based at least in part upon the evaluation result.

20. The article of manufacture of claim 16, the set of acts further comprising:
    flattening the hierarchical level into the extracted view while preserving a first hierarchical level that does not pertain to extracted models in the electronic design;
    preserving an original schematic design of the first hierarchical level in the schematic of the electronic design without flattening the first hierarchical level into the extracted view;
    populating contents of the original schematic design of the first hierarchical level into the extracted view;
    binding the extracted model with the extracted view at least by interconnecting the extracted model in the extracted view based at least in part upon first connectivity information of the electronic design;
    identifying a simulation model for characterizing the electronic design with at least an extracted view;
    determining a hierarchical block at the first hierarchical level based at least in part upon the simulation model; and
    binding the simulation model with the extracted view at least by interconnecting the simulation model in the extracted view based at least in part upon second connectivity information of the electronic design.

* * * * *